(12) United States Patent
Mick

(10) Patent No.: US 6,785,188 B2
(45) Date of Patent: Aug. 31, 2004

(54) FULLY SYNCHRONOUS PIPELINED RAM

(75) Inventor: John R. Mick, San Jose, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 10/059,899

(22) Filed: Jan. 28, 2002

(65) Prior Publication Data

US 2002/0154548 A1 Oct. 24, 2002

Related U.S. Application Data

(60) Continuation of application No. 09/625,382, filed on Jul. 25, 2000, which is a continuation of application No. 09/429,849, filed on Oct. 28, 1999, now Pat. No. 6,249,480, which is a division of application No. 09/253,577, filed on Feb. 19, 1999, now Pat. No. 6,094,399, which is a continuation of application No. 08/864,456, filed on May 28, 1997, now Pat. No. 5,875,151, which is a division of application No. 08/635,128, filed on Apr. 19, 1996, now Pat. No. 5,838,631.

(51) Int. Cl.$^7$ .................................................. G11C 8/00
(52) U.S. Cl. ...................................... 365/233; 365/191
(58) Field of Search ................................. 365/233, 191

(56) References Cited

U.S. PATENT DOCUMENTS

| | | | |
|---|---|---|---|
| 3,967,247 A | 6/1976 | Andersen et al. | |
| 4,096,402 A | 6/1978 | Schroeder et al. | |
| 4,208,716 A | 6/1980 | Porter et al. | |
| 4,225,922 A | 9/1980 | Porter | |
| 4,371,929 A | 2/1983 | Brann et al. | |
| 4,394,732 A | 7/1983 | Swenson | |

(List continued on next page.)

FOREIGN PATENT DOCUMENTS

| | | | |
|---|---|---|---|
| EP | 0276871 A2 | 8/1988 | |
| EP | 0294287 | 12/1988 | |
| EP | 0432509 A2 | 6/1991 | |
| EP | 0450871 A2 | 10/1991 | |
| EP | 0655741 A2 | 5/1995 | |
| EP | 0680049 A2 | 11/1995 | |
| EP | 0692872 A2 | 1/1996 | |
| EP | 1130603 A2 | 9/2001 | ......... G11C/11/406 |
| JP | 2-112317 | 4/1990 | |
| JP | 4-135311 | 8/1992 | |
| JP | 5-136664 | 1/1993 | |
| JP | 5-282868 | 10/1993 | |
| WO | WO 94/29871 | 12/1994 | |
| WO | WO 97/03445 | 1/1997 | |
| WO | WO 97/14289 | 4/1997 | |
| WO | WO 97/15055 | 4/1997 | |

OTHER PUBLICATIONS

Motorola, Inc. "Semiconductor Technical Data: The Motorola BurstRAM™," Nov. 17, 1999, pp. 1–4.

Integraged Device Technology, Inc., "Self–Timed BiCMOS ECL Static RAM: 64K (16K×4–BIT) STRAM", Aug. 1992, pp. 1–8.

Primary Examiner—Van Thu Nguyen
Assistant Examiner—Tuan Nguyen
(74) Attorney, Agent, or Firm—Finnegan, Henderson, Farabow, Garrett & Dunner, LLP

(57) ABSTRACT

A memory system includes a memory, an input circuit and a logic circuit. The input circuit is coupled to receive a memory address and, during a write operation, the corresponding write data to be written into the SRAM. The logic circuit causes the write data to be stored in the input circuit for the duration of any sequential read operations immediately following the write operation and then to be read into the memory during subsequent write operation. During the read operation, data which is stored in the write data storage registers prior to being read into the memory can be read out from the memory system should the address of one or more read operations equal the address of the data to be written into the memory while temporarily stored in the write data storage registers. Thus, no "bus turnaround" down time is experienced by the system thereby increasing the bandwidth of the system. The system can operate in a single pipeline mode or a dual pipeline mode.

20 Claims, 21 Drawing Sheets

U.S. PATENT DOCUMENTS

| | | | |
|---|---|---|---|
| 4,394,733 A | 7/1983 | Swenson | |
| 4,410,942 A | 10/1983 | Milligan et al. | |
| 4,415,970 A | 11/1983 | Swenson et al. | |
| 4,423,479 A | 12/1983 | Hanson et al. | |
| 4,426,681 A | 1/1984 | Bacot et al. | |
| 4,433,374 A | 2/1984 | Hanson et al. | |
| 4,437,155 A | 3/1984 | Sawyer et al. | |
| 4,442,488 A | 4/1984 | Hall | |
| 4,476,526 A | 10/1984 | Dodd | |
| 4,490,782 A | 12/1984 | Dixon et al. | |
| 4,523,275 A | 6/1985 | Swenson et al. | |
| 4,530,054 A | 7/1985 | Hamstra et al. | |
| 4,530,055 A | 7/1985 | Hamstra et al. | |
| 4,547,848 A | 10/1985 | Nishida et al. | |
| 4,611,337 A | 9/1986 | Evans | |
| 4,695,943 A | 9/1987 | Keeley et al. | |
| 4,755,930 A | 7/1988 | Wilson, Jr. et al. | |
| 4,789,796 A | 12/1988 | Foss | |
| 4,794,521 A | 12/1988 | Ziegler et al. | |
| 4,796,231 A * | 1/1989 | Pinkham | 365/189.05 |
| 4,817,058 A | 3/1989 | Pinkham | |
| 4,882,709 A | 11/1989 | Wyland | |
| 4,912,630 A | 3/1990 | Cochcroft, Jr. | |
| 4,916,604 A | 4/1990 | Yamamoto et al. | |
| 4,928,281 A | 5/1990 | Kurosawa et al. | |
| 4,942,550 A | 7/1990 | Murray | |
| 4,958,088 A | 9/1990 | Farah-Bakhsh et al. | |
| 4,984,204 A | 1/1991 | Sato et al. | |
| 5,022,011 A | 6/1991 | Allan | |
| 5,043,937 A | 8/1991 | Glaise | |
| 5,111,435 A | 5/1992 | Miyamoto | |
| 5,128,563 A | 7/1992 | Hush et al. | |
| 5,150,186 A | 9/1992 | Pinney et al. | |
| 5,165,046 A | 11/1992 | Hesson | |
| 5,170,074 A | 12/1992 | Aoki | |
| 5,179,298 A | 1/1993 | Hirano et al. | |
| 5,195,056 A | 3/1993 | Pinkham et al. | |
| 5,220,208 A | 6/1993 | Schenck | |
| 5,239,206 A | 8/1993 | Yanai | |
| 5,251,181 A | 10/1993 | Toda | |
| 5,254,883 A | 10/1993 | Horowitz et al. | |
| 5,276,642 A | 1/1994 | Lee | |
| 5,281,865 A | 1/1994 | Yamashita et al. | |
| 5,321,368 A | 6/1994 | Hoelzle | |
| 5,321,651 A | 6/1994 | Monk | 365/189.01 |
| 5,341,341 A | 8/1994 | Fukuzo | |
| 5,347,177 A | 9/1994 | Lipp | |
| 5,349,566 A | 9/1994 | Merritt et al. | |
| 5,377,338 A | 12/1994 | Olson et al. | |
| 5,383,157 A | 1/1995 | Phelan | |
| 5,384,737 A | 1/1995 | Childs et al. | 365/189.05 |
| 5,384,745 A | 1/1995 | Konishi et al. | |
| 5,387,809 A | 2/1995 | Yamagishi et al. | |
| 5,390,308 A | 2/1995 | Ware et al. | |
| 5,394,555 A | 2/1995 | Hunter et al. | |
| 5,400,283 A | 3/1995 | Raad | |
| 5,438,545 A | 8/1995 | Sim | |
| 5,440,260 A | 8/1995 | Hayashi et al. | |
| 5,444,667 A * | 8/1995 | Obara | 365/233 |
| 5,457,407 A | 10/1995 | Shu et al. | |
| 5,467,473 A | 11/1995 | Kahle et al. | |
| 5,473,575 A | 12/1995 | Farmwald et al. | |
| 5,475,642 A | 12/1995 | Taylor | |
| 5,483,497 A | 1/1996 | Mochizuki et al. | |
| 5,487,035 A | 1/1996 | Nishimura et al. | |
| 5,488,712 A | 1/1996 | Kiuchi | 395/431 |
| 5,497,127 A | 3/1996 | Sauer | |
| 5,498,990 A | 3/1996 | Leung et al. | |
| 5,502,676 A | 3/1996 | Pelley, III et al. | 365/200 |
| 5,506,814 A | 4/1996 | Hush et al. | |
| 5,513,327 A | 4/1996 | Farmwald et al. | |
| 5,515,325 A | 5/1996 | Wada | 365/189.01 |
| 5,523,320 A | 6/1996 | Akiyama | |
| 5,526,320 A | 6/1996 | Zagar | |
| 5,546,344 A | 8/1996 | Fawcett | |
| 5,561,781 A | 10/1996 | Braceras et al. | |
| 5,568,077 A | 10/1996 | Sato et al. | |
| 5,568,430 A | 10/1996 | Ting | |
| 5,572,467 A | 11/1996 | Ghassemi et al. | 365/189.02 |
| 5,574,698 A | 11/1996 | Raad | |
| 5,576,645 A | 11/1996 | Farwell | |
| 5,577,236 A | 11/1996 | Johnson et al. | |
| 5,578,941 A | 11/1996 | Sher et al. | |
| 5,581,197 A | 12/1996 | Motley et al. | |
| 5,581,718 A | 12/1996 | Grochowski | |
| 5,581,734 A | 12/1996 | DiBrino et al. | |
| 5,594,700 A | 1/1997 | Ward et al. | |
| 5,617,362 A | 4/1997 | Mori et al. | |
| 5,619,473 A | 4/1997 | Hotta | |
| 5,621,690 A | 4/1997 | Jungroth et al. | |
| 5,627,780 A | 5/1997 | Malhi | |
| 5,627,791 A | 5/1997 | Wright et al. | |
| 5,629,453 A | 5/1997 | Roohparvar et al. | |
| 5,631,872 A | 5/1997 | Naritake et al. | |
| 5,636,163 A | 6/1997 | Furutani et al. | |
| 5,636,173 A | 6/1997 | Schaefer | |
| 5,636,174 A | 6/1997 | Rao | |
| 5,638,335 A | 6/1997 | Akiyama et al. | |
| 5,644,729 A | 7/1997 | Amini et al. | |
| 5,650,971 A | 7/1997 | Longway et al. | |
| 5,652,724 A | 7/1997 | Manning | 365/189.05 |
| 5,655,105 A | 8/1997 | McLaury | |
| 5,659,696 A | 8/1997 | Amini et al. | |
| 5,663,901 A | 9/1997 | Wallace et al. | |
| 5,668,763 A | 9/1997 | Fujioka et al. | |
| 5,675,549 A | 10/1997 | Ong et al. | 365/233.5 |
| 5,694,065 A | 12/1997 | Hamasaki et al. | |
| 5,699,317 A | 12/1997 | Sartore et al. | 365/230.06 |
| 5,717,904 A | 2/1998 | Ehlers et al. | |
| 5,737,276 A | 4/1998 | Shin et al. | |
| 5,748,558 A | 5/1998 | Suzuki | 365/233 |
| 5,754,815 A | 5/1998 | Ernst et al. | |
| 5,757,704 A | 5/1998 | Hachiya | 365/189.07 |
| 5,761,147 A | 6/1998 | Lindner et al. | |
| 5,761,150 A | 6/1998 | Yukutake et al. | 365/233 |
| 5,777,942 A | 7/1998 | Dosaka et al. | 365/230.03 |
| 5,781,480 A | 7/1998 | Nogle et al. | 365/189.04 |
| 5,781,481 A | 7/1998 | Iwakiri | |
| 5,790,838 A | 8/1998 | Irish et al. | 395/555 |
| 5,793,688 A | 8/1998 | McLaury | 365/203 |
| RE35,934 E | 10/1998 | Takai | 365/189.05 |
| 5,819,060 A | 10/1998 | Cesana | |
| 5,825,711 A | 10/1998 | Manning | |
| 5,828,606 A | 10/1998 | Mick | 365/189.05 |
| 5,831,929 A | 11/1998 | Manning | |
| 5,838,631 A | 11/1998 | Mick | 365/233 |
| 5,841,732 A | 11/1998 | Mick | 365/233 |
| 5,847,577 A | 12/1998 | Trimberger | |
| 5,854,911 A | 12/1998 | Watkins | |
| 5,870,347 A | 2/1999 | Keeth et al. | |
| 5,875,151 A | 2/1999 | Mick | 365/233 |
| 5,875,152 A | 2/1999 | Liu et al. | |
| 5,890,195 A | 3/1999 | Rao | |
| 5,915,105 A | 6/1999 | Farmwald et al. | |
| 5,917,772 A | 6/1999 | Pawlowski | |
| 5,933,385 A | 8/1999 | Jiang et al. | 365/230.01 |
| 5,978,311 A | 11/1999 | Wilford et al. | |
| 6,044,429 A | 3/2000 | Ryan et al. | 710/131 |
| 6,052,769 A | 4/2000 | Huff et al. | |
| 6,058,448 A | 5/2000 | Pawlowski | |
| 6,064,625 A * | 5/2000 | Tomita | 365/233 |

| | | |
|---|---|---|
| 6,078,527 A | 6/2000 | Roth et al. |
| 6,081,478 A | 6/2000 | Mick et al. ................ 365/233 |
| 6,094,399 A | 7/2000 | Mick .......................... 365/233 |
| 6,115,320 A | 9/2000 | Mick et al. ................ 365/233 |
| 6,144,616 A | 11/2000 | Suzuki et al. |
| 6,151,236 A | 11/2000 | Bondurant et al. ........... 365/49 |
| 6,163,500 A | 12/2000 | Wilford et al. |
| 6,167,487 A | 12/2000 | Camacho et al. |
| 6,212,109 B1 | 4/2001 | Proebsting ................. 365/190 |
| 6,219,283 B1 | 4/2001 | Wilford |
| 6,249,480 B1 | 6/2001 | Mick .......................... 365/233 |
| 6,256,716 B1 | 7/2001 | Pham ......................... 711/167 |
| 6,259,648 B1 | 7/2001 | Kragick ................. 365/230.05 |
| 6,272,064 B1 | 8/2001 | Wilford et al. |
| 6,292,428 B1 * | 9/2001 | Tomita et al. .............. 365/233 |
| 6,314,051 B1 * | 11/2001 | Farmwald et al. .......... 365/233 |
| 6,373,783 B1 * | 4/2002 | Tomita ....................... 365/233 |
| 6,438,066 B1 * | 8/2002 | Ooishi et al. ............... 365/233 |
| 6,567,338 B1 | 5/2003 | Mick .......................... 365/233 |
| 6,591,354 B1 | 7/2003 | Mick et al. ................. 711/169 |

OTHER PUBLICATIONS

IBM Corporation Datasheet, "IBM043611RLAB, IBM041811RLAB: 32×36 & 64K×18 SRAM," Jun. 1996, pp. 1–20.

IBM Corporation Datasheet, "IBM043610QLAB, IBM041810QLAB: 32K×36 & 64K×18 SRAM," Jul., 1996, pp. 1–21.

IBM Corporation Datasheet, "IBM043611QLAB, IBM041811QLAB: 32K×36 & 64K×18 SRAM," Jul., 1996, pp. 1–21.

Motorola, "Semiconductor Technical Data: MCM69L738 & MCM69L820: Advance Information: $M Late Write 2.5 V I/O," 15 pp.

Motorola, "Semiconductor Technical Data: MCM62486: Product Review: 32K×9 Bit BurstRAM™ Synchronous Static RAM With Burst Counter and Self–Timed Write," 1991, pp. 1–4, 6, 8–9.

Sony CXK77B3611 Advanced Information, "32,768–WORD by 36–Bit High Speed BiCMOS Synchronous Static RAM", Dec. 10, 1994, (pp. 1, 3, & 9).

Motorola, "Dual Differential Clock Synchronous FSRAM with Very Late Write and Asynchronous /G", Print Date: Jul. 9, 1993, Rev. 1.03 (pp. 13–16).

Sweazey, Paul, "SRAM Organization, Control, and Speed, and their Effect on Cache Memory Design," 1987, pp.434–437.

Bennett, Steve, "SRAMs: if synchronous just isn't enough," Electronic Product Design, Jul. 1997, pp. 29–30.

GSI Technology, "Company Overview," Aug. 2001, pp. 1–5.

Andrew MacLellan, "Rivals To Cooperate On SRAM Project," Jul. 26, 1999, pp. 1–2.

Integrated Device Technology, Inc., "IDT Introduces Revolutionary ZBT™ Synchronous SRAM Architecture," 1996, pp. 1–3.

Brian Dipert, "No–latency SRAMs tackle fast–changing data," Cypress Semiconductor, 1997, pp. 1–2.

Integrated Device Technology, Inc., News Release in Japanese, Sep. 15, 1997, pp. 1–2, no translation provided.

Semiconductor Business News, "Micron Samples 8–Mbit Smart ZBT SRAM," Oct. 21, 1999, 1 p.

Will Wade, "IDT and Micron team up for smart ZBT SRAM," EE Times, Aug. 25, 1999, 1 p.

Shekhar Bapat, "Synthesizable 200 MHz SRAM Interface," Xilinx, Jan. 10, 2000, pp. 1–6.

Prince, Betty, *Semiconductor Memories: A Handbook of Design, Manufacture and Application,* $2^{nd}$ ed., 1991, pp. 467–472.

Cypress Semiconductor Corporation, "SRAMs & MODULES: NoBL™ SRAMs", 2001, pp. 1–2.

Cypress Semiconductor Corporation, "NoBL™ SRAM Fact Sheet," pp. 1–2.

Cypress Semiconductor Corporation, "Introduction to Cypress SRAMs," Apr. 20, 2001, pp. 1–3.

Cypress Semiconductor Corporation, "NoBL: The Fast SRAM Architecture," Jun. 29, 1998, pp. 1–8.

Cypress Semiconductor Corporation, "NoBL™, The ZBT™–Compatible . . . ," Jun. 26, 1998, pp. 1–3.

Integrated Device Technology, Inc., "IDT Introduces Industry's Fastest 4–Mit Synchronous ZBT SRAM," Mar. 30, 1998, pp. 1–3.

Abstract of "Synchronous SRAMs having zero bus turnaround time," Elektronik Industrie, Dec. 1996, 1 p.

Integrated Device Technology, Inc. "128K×36, 3.3V Synchronous SRAM with ZBT™ Feature, Burst Counter and Pipelined Outputs," Dec. 1999, pp. 1–20.

Computer Design, "Application–specific memory evolves," Dec. 1998, pp. 1–4.

Craig Matsumoto, "Cypress Details Product Road Map," Nov. 17, 1998, pp. 1–2.

Descriptive literature entitled, "*400 MHz SLDRAM, 4M × 16 SLDRAM Pipelined, Eight Bank, 2.5 V Operation,*" SLDRAM Consortium Advance Sheet, published throughout the U.S., pp. 1–22.

"*Draft Standard for a High–Speed Memory Interface (SyncLink),*"Microprocessor and Microcomputer Standards Subcommittee of the IEEE Computer Society, Copyright 1996 by the Institute of Electrical and Electronic Engineers, Inc., New York, NY, pp. 1–56.

Taguchi, M. et al., "*A 40–ns 64–Mb DRAM with 64–b Parallel Data Bus Architecture,*" IEEE Journal of Solid–State Circuits, vol. 26, Nov. 1991, pp. 1493–1497.

Gibson, Glenn A., *Computer Systems—Concepts and Design,* Prentice Hall, Inc., Englewood Cliffs, New Jersey, 1991, pp. 366–369 and 452–493.

"*64K × 32, 3.3V Synchronous SRAM With Pipelined Outputs and Interleaved/Linear Burst Counter, Preliminary IDT71V632,*" Integrated Device Technology, Inc., Product Information, Mar. 1997, 14 pages.

"*64K × 32, 3.3V Synchronous SRAM With Flow–Through Outputs–Preliminary IDT71V633,*" Integrated Device Technology, Inc., Product Information, Apr. 1997, 15 pages.

Nakamura, Kazuyuki et al, SP 24.6: *A 500MHz 4Mb CMOS Pipeline–Burst Cache SRAM with Point–to–Point Noise Reduction Coding I/O,* 1997 IEEE International Solid State Circuits Conference, Digest of Technical Papers, First Edition, Feb. 1997, (9) pages.

U.S. District Court of Delaware (Wilmington) Case No. 01–CV–393/01–393–SLR, Integrated Device v. GSI Technology, et al., Summons in a Civil Action dated Jul. 11, 2001; Civil Cover Sheet dated Jun. 11, 2001; Complaint for Patent Infringement dated Jun. 11, 2001 and accompanying documents; Order dated Dec. 20, 2001; Joint Discovery Plan and Proposed Scheduling Order dated Sep. 2001, Order dated Oct. 24, 2001; Joint Discovery Plan and [Proposed] Scheduling Order dated Oct. 23, 2001; Order for Scheduling Conference dated Aug. 3, 2001; Reply to Counterclaim dated Aug. 7, 2001; Answer to First Amended Complaint for Patent Infringement and Counterclaim dated Jul. 19, 2001; Jury Trial Demand dated Jul. 19, 2001; Affidavit of Andrew J. Huffman dated Jul. 17, 2001 with Exhibits A, B and C; Summons in a Civil Action dated Jun. 28, 2001; First Amended Complaint for Patent Infringement dated Jun. 28, 2001; Notice of Assignment of Judge dated Jun. 20, 2001;

Letter from Mary B. Graham of Morris, Nichols, Arsht & Tunnell to William J. Marsden, Jr. at Fish & Richardson, dated May 15, 2002; and First Amended Answer to First Amended Complaint for Patent Infringement and Amended Counterclaims dated May 15, 2002.

U.S. District Court of Delaware (Wilmington) Case No. 01–CV–393/01–393–SLR, Integrated Device v. GSI Technology, et al.,, Docket as of Jul. 31, 2003, 8:03 p.m. from Web PACER (v2.4).

* cited by examiner

| CLOCK CYCLE | 0 | 1 | 2 | 3 | 4 | 5 | 6 | 7 | 8 |
|---|---|---|---|---|---|---|---|---|---|
| ADDRESS | A0 | A1 | A2 | A3 | A4 | A5 | A6 | A7 | A8 |
| | R | R | W | R | W | W | R | | |
| | | READ | READ | WRITE | READ | WRITE | WRITE | READ | |
| | | A0 | A1 | A2 | A3 | A4 | A5 | | |
| DATA OUT | | | D0 | D1 | | D3 | | | |
| DATA IN | | | | | D2 | | D4 | D5 | |
DOUBLE PIPE READ
FIG. 5C
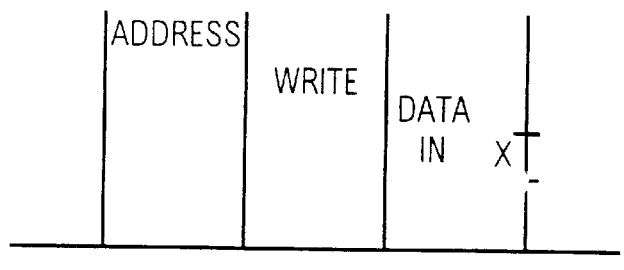
DOUBLE PIPE WRITE
FIG. 5B
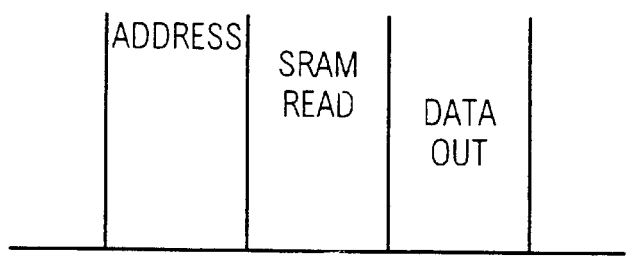
DOUBLE PIPE READ
FIG. 5A

| FIG. 6B-1 | FIG. 6B-2 |

FIG. 6B-2

| FIG.7B-1 |
| FIG. 7B-2 |

FULLY SYNCHRONOUS PIPELINED RAM

RELATED APPLICATION

This application is a continuation application of Ser. No. 09/625,382, filed Jul. 25, 2000, which is a continuation application of Ser. No. 09/429,849, filed Oct. 28, 1999 now U.S. Pat. No. 6,249,480, which is a divisional of U.S. application Ser. No. 09/253,577 filed Feb. 19, 1999 (now U.S. Pat. No. 6,094,399), which is a continuation of Ser. No. 08/864,456, filed May 28, 1997 (now U.S. Pat. No. 5,875,151), which is a divisional application of Ser. No. 08/635,128, filed Apr. 19, 1996 (now U.S. Pat. No. 5,838,631).

FIELD OF THE INVENTION

This invention relates to memory circuits and, more particularly, to fully synchronous pipelined random access memory circuits.

BACKGROUND

Many high performance systems require a memory that operates with a fast system clock. Some designers use synchronous random access memories ("RAMs") to meet this system requirement. For example, some synchronous static RAMs (SRAMs) are available which use registers or latches to temporarily store the address and control. These SRAMs use a "pipeline" scheme whereby the address to be accessed is provided during one cycle and, during the next sequential cycle, the data is provided on the data bus. For example, during a read operation, the address from which data is to be read is provided on the nth cycle and the data read from the SRAM is provided on the data bus on the (n+1)th cycle. For write operations, there are SRAMs that provide the address, control and data during the same cycle and there are designs where address and control are provided on the nth cycle and data is provided on the (n+1)th cycle.

The speed of the SRAM is increased because the set-up and hold time for a register or latch is typically much shorter than the time to access the main array of the SRAM (the difference typically being several nanoseconds). The result is to break the operations into shorter cycles. On the (n+1)th cycle, the register or latch provides the stored address to the SRAM's main array along with the data to be written to the stored address, meeting the set-up and hold times for writing to the SRAM's main array. Because of the reduced set-up and hold time for the address and data on the (n+1)th cycle, the SRAM's cycle time, as viewed at the pins of the device, can be significantly reduced. As a result, the frequency of the system clock can be increased.

One problem with conventional SRAMs is that, typically, trying to intermix reads and writes in a high speed system causes a cycle to be "lost" when a memory write is immediately followed by a memory read (i.e., bus turnaround). Generally, a cycle is lost on turnaround because the structure of these RAMs requires an extra cycle to make sure that all of the data is written into the memory before a read operation can be performed. For example, if a write operation is followed by a read operation from the same address, a lost cycle is needed so that the "new" data will be written to the specified address before the read operation is performed on the data stored at the same address. In systems where bus turnaround occurs frequently, the lost cycles on bus turnaround can significantly reduce the bandwidth of the system. With conventional synchronous SRAMs, the same problem can exist.

SUMMARY

According to the present invention, a fully synchronous pipelined RAM with no lost cycles on bus turnaround is provided (i.e., the RAM is capable of performing a read operation during any clock cycle or a write operation during any clock cycle without limitation).

One embodiment of the present invention, an SRAM, includes a memory, an input circuit and a logic circuit. The input circuit is coupled to receive a memory address and control signals during any cycle referred to as the nth cycle. During a write operation on the nth cycle, the corresponding write data to be written into the SRAM is provided during the next, (n+1)th, cycle. During the nth cycle, the logic circuit causes the previously stored write data to be written from the input circuit into the memory. The new write data associated with the address and control signal received on the nth cycle is received into the input circuit on the (n+1)th cycle. The write data and the address remain in the input circuit during any intervening read operations.

In this embodiment, when performing a read operation, the logic circuit compares the address of the read operation to the address of the most recent write operation. If the addresses match, then the SRAM outputs the data stored in the input circuit; however, if the addresses do not match, the SRAM outputs the data stored in the memory corresponding to the requested read address.

In another embodiment of the present invention, an SRAM includes an input circuit, an output circuit, a logic circuit and a memory. In this embodiment, the input circuit is coupled to receive a memory address and control signals during any cycle referred to as the nth cycle. The output circuit includes a register to store data read from the memory which is read during the (n+1)th cycle. Data will then be provided out of the output circuit on the next, (n+2)th, cycle.

The logic circuit causes the write data to be stored in a first data register in the input circuit two clock cycles after receipt of the write address and control signals. This data will move through the two-stage pipeline in the input circuit during intervening read operations. Thus, write data is written into the memory during the second write operation after the data has been received in the input circuit. These operations and their associated variations will be more fully understood in accordance with the detailed description taken with the drawings.

When performing a read operation, the logic circuit compares the address of the read operation to the addresses of the previous two write operations. If the read address matches one of the write-addresses stored in the input circuit, then the SRAM outputs to the output circuit the data corresponding to the matched address from the input circuit to the output circuit; if the read address matches both of the write-addresses stored in the input circuit, then the SRAM outputs to the output circuit the data corresponding to the most recently written matched address from the input circuit to the output circuit; however, if the addresses do not match, the SRAM outputs to the output circuit the data stored in the memory corresponding to the requested read address.

This invention will be more fully understood in accordance with the following detailed description taken with the drawings.

BRIEF DESCRIPTION OF THE DRAWINGS

FIGS. 5A, 5B and 5C show timing diagrams illustrating the operation of the embodiment of FIG. 4.

Figure 6A-1:
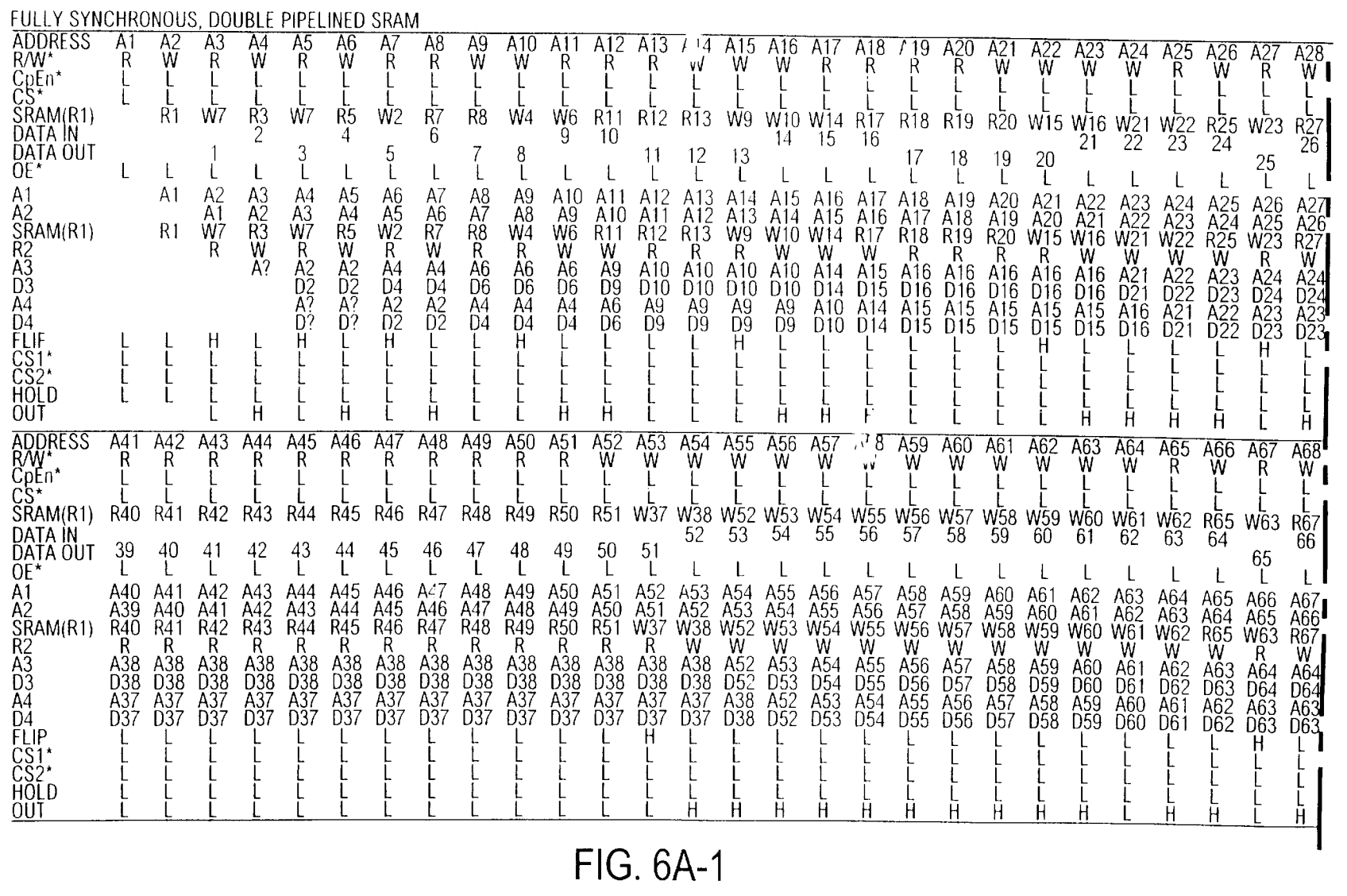
Figure 6B-1:
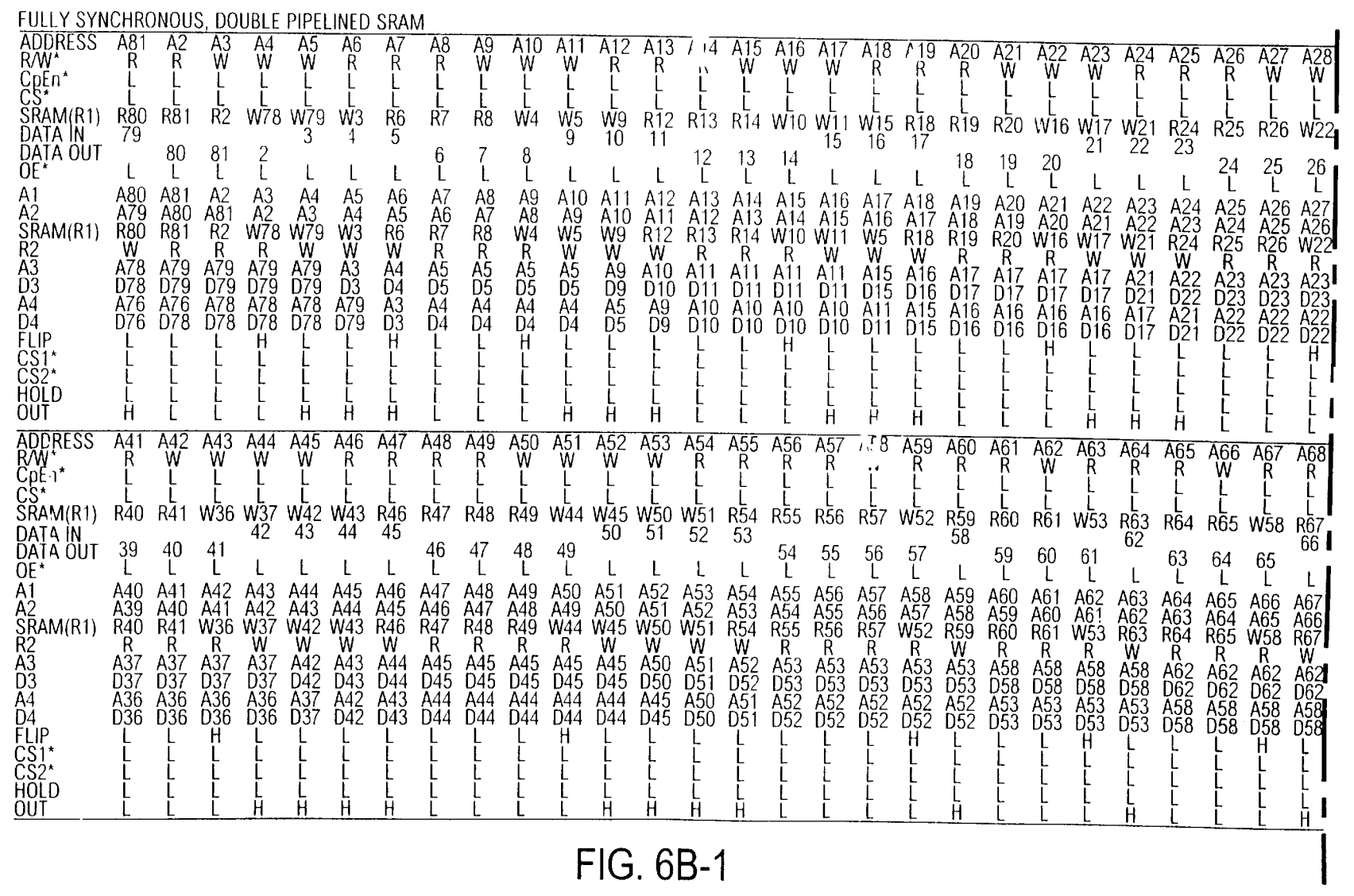

FIGS. 6A (comprising sheets 6A-1 and 6A-2) and 6B (comprising sheets 6B-1 and 6B-2) illustrate the logic states of certain components and terminals shown in FIG. 7 for two different read/write sequences applied to the structure shown in FIG. 7 in the double pipelined (i.e., two-stage -pipeline) mode.

DETAILED DESCRIPTION

Figure 1:
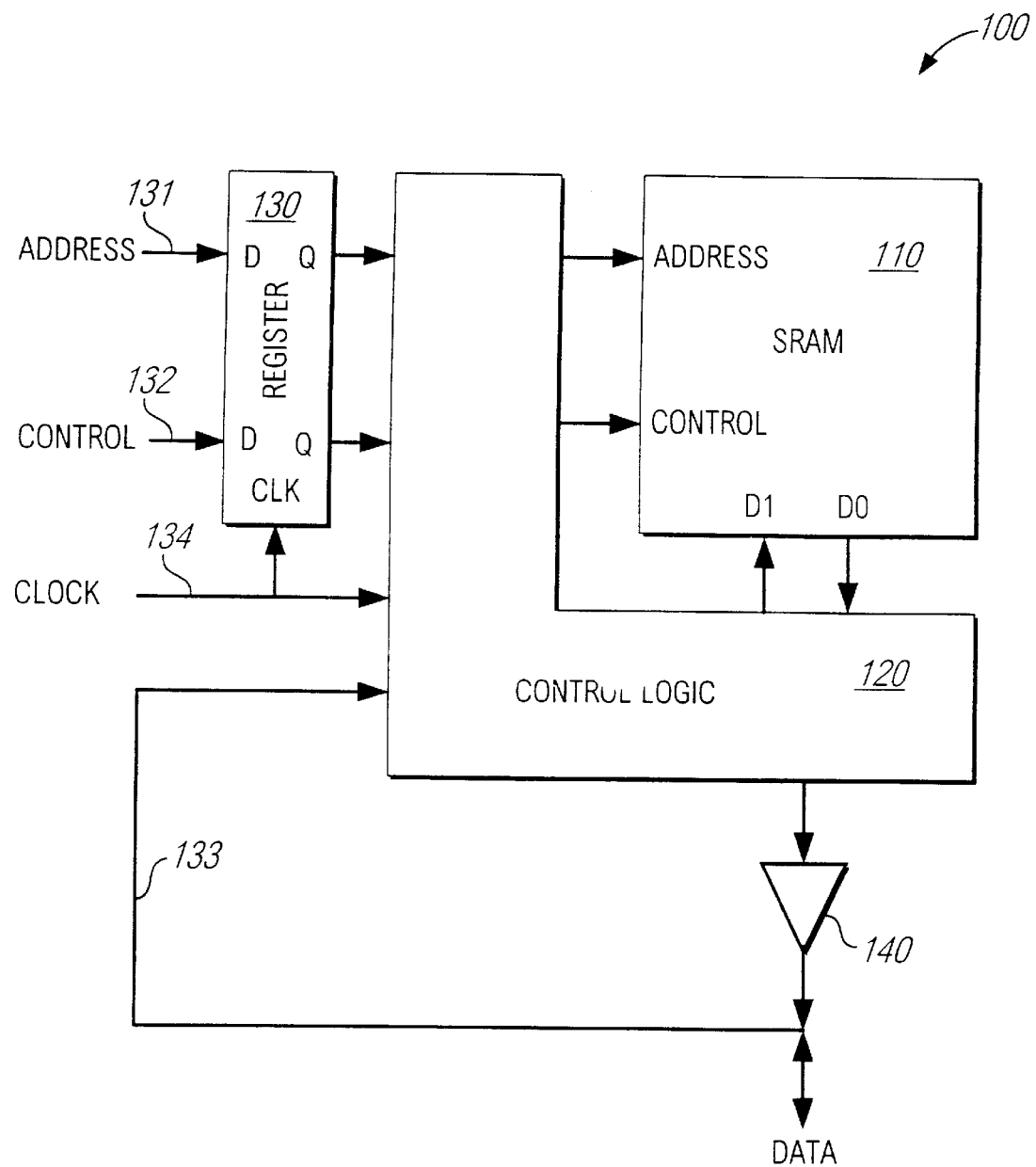
FIG. 1 shows a block diagram of one embodiment of the present invention using a single stage pipeline.

FIG. 1 shows a simplified block diagram of a single pipeline SRAM 100 according to one embodiment of the present invention. Although this embodiment utilizes SRAM memory cells, this invention also can be embodied using DRAM memory cells. SRAM 100 includes a memory 110 connected to control logic 120, which is connected to an input circuit 130. Input circuit 130 is coupled to receive address, control, and clock signals from a processor or controller (not shown) on input address bus 131, input control lead or bus 132, and input clock lead 134, respectively. Input data bus 133 is connected to control logic 120.

A read operation is performed as follows. During the nth cycle, the processor or controller (not shown) provides to SRAM 100 an address to be read on bus 131. The processor or controller also indicates a read operation by asserting (i.e. taking high) the read/write signal transmitted on control lead or bus 132. During the (n+1)th cycle, control logic 120 compares the address of the read operation stored in input circuit 130 to the address stored in control logic 120 during the most recent write operation. If the addresses match, then control logic 120 outputs the data stored in the control logic 120 corresponding to the most recent write operation via an output buffer 140; however, if the addresses do not match, control logic 120 outputs, via output port Do and buffer 140, the data stored in SRAM memory 110 corresponding to the address of the read operation. Because the data is read from control logic 120 when a read operation sequentially follows a write operation and the address of the data to be read corresponds to the address to which the last received write data is to be written, no extra cycle is needed to write the data into memory 110 before it can be read as in conventional synchronous SRAMs. As a result, lost cycles are eliminated during bus turnaround, thereby increasing the bandwidth of a system using SRAM 100.

A write operation is performed as follows. The processor or controller (not shown) provides to SRAM 100 an address on bus 131 during an nth cycle. The processor or controller also indicates a write operation by deasserting (i.e. taking low) a read/write signal transmitted on input control lead or bus 132. Control lead 132 may be replaced by a bus which can then carry other control signals, such as a chip enable signal and a chip select signal. The processor provides on the (n+1)th cycle the corresponding data on bus 133 (called "write data") to be written to SRAM 110 during the (n+2)th write cycle at the address on bus 131 during the nth cycle.

Input circuit 130 receives and stores the address and control on one cycle and the corresponding write data on the next following cycle. Input circuit 130 receives the address and control and input logic 120 receives the write data with a much shorter set up and hold time relative to a typical SRAM memory, thereby allowing SRAM 100 to have a shorter cycle time.

During the (n+1)th cycle, control logic circuit 120 causes the write data stored in control logic 120 during the previous write operation to be written into SRAM memory 110 and stored there at the address also stored in control logic 120 associated with that write data.

Logic circuit 120 simply holds the write data and write address during any intervening read operations.

Figure 2:
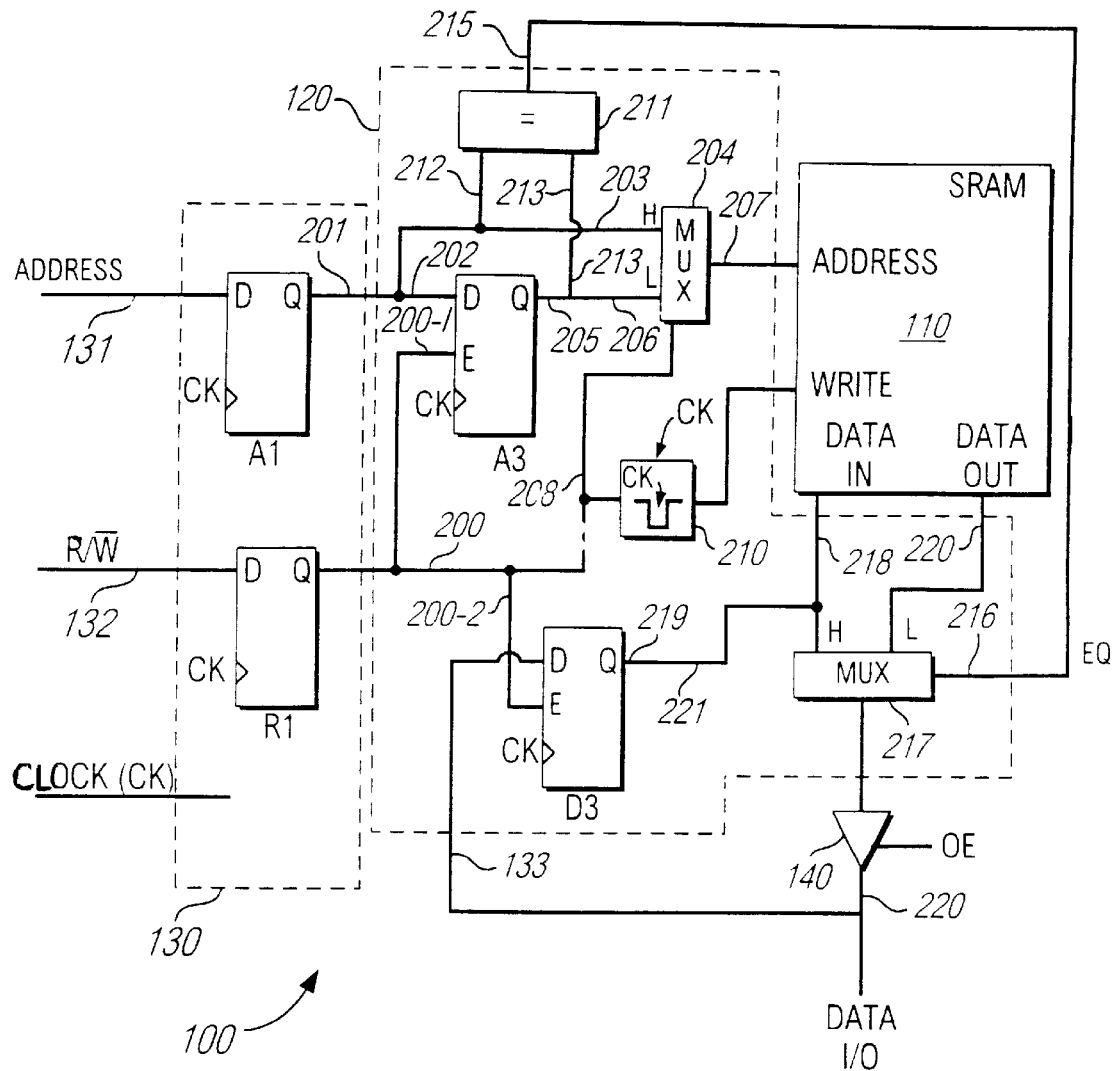
FIG. 2 shows a more detailed diagram of the embodiment of FIG. 1.

FIG. 2 shows an embodiment of the SRAM system 100 in FIG. 1. Like reference numerals are used between drawings for like structures. SRAM system 100 includes registers A1, A3, R1 and D3. Register A3 and register D3 each includes an enable input lead 200-1 and 200-2 respectively. When register A3 or register D3 receives a logic low signal on enable input lead 200-1 or enable input lead 200-2, respectively, register A3 or register D3 will operate as a conventional register. However, register A3 and register D3 each will not alter the stored information on its output bus 205 or 221, respectively, while a logic high signal is received on enable input lead 200-1 or enable input lead 200-2, respectively.

Registers A1, R1 and D3 are respectively coupled to receive the address signals via bus 131, the read/write control signal via bus 132 and the data signals from the Data I/O input port via bus 133. The output bus 201 of register A1 is connected to the input bus 202 of register A3 and to the H input port 203 of a multiplexer 204. The output bus 205 of register A3 is connected to the L input port 206 of multiplexer 204. The output port 207 of multiplexer 204 is connected to the address port of memory 110. Thus, multiplexer 204 operates to provide either the address stored in register A1 or the address stored in register A3 to memory 110 to identify in memory 110 either the address from which read data is to be read or the address to which write data is to be written.

Multiplexer 204 is controlled by the read/write signal stored in register R1, which signal register R1 provides to the select input lead of multiplexer 204 via line 208. The stored read/write signal, when asserted (i.e. high) to indicate a read operation, causes multiplexer 204 to pass the output signals of register A1 to the address port of memory 110.

Conversely, the stored read/write signal, when deasserted (i.e. low) to mean a data-write operation, causes multiplexer 204 to pass the output signals of register A3 to the address port of memory 110; the write data signals in register D3 are already applied to the Data-In port of memory 110.

In addition, the stored read/write signal, when deasserted to indicate a write operation, enables register A3 to store the output address signals from register A1 and further enables new write data to be stored in register D3, this new write data being associated with the address signals being transferred from address register A1 to address register A3. All register storage is on the rising clock edge where the clock signal transitions from low-to-high.

Figure 3:
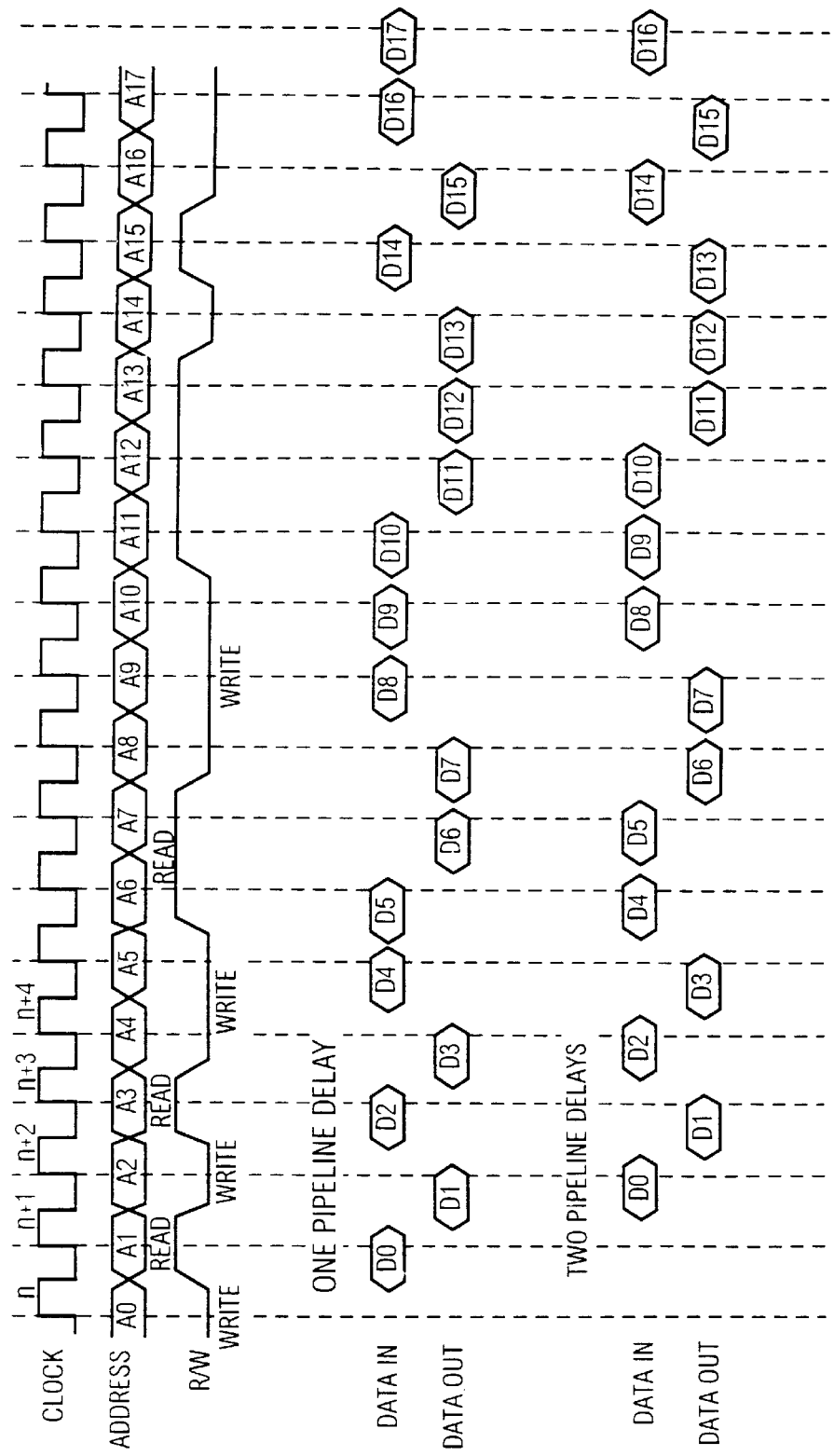
FIG. 3 shows a timing diagram illustrating the operation of the embodiment of FIG. 2.

FIG. 3 shows a timing diagram exemplifying a series of read and write operations. With reference to FIGS. 2 and 3, a read operation is performed as follows. In the nth cycle, the read/write signal into register R1 is asserted (i.e. goes high) on lead 132. Register R1 receives and stores the asserted read/write signal on the rising edge of the clock signal at the end of the nth cycle (i.e. the start of the (n+1)th cycle) and outputs the asserted read/write signal at the beginning of the (n+1)th cycle. At the same nth cycle as the read/write signal into register R1 is asserted, register A1 receives the read address on input bus 131, and on the next rising edge of the clock signal at the start of the (n+1)th cycle, stores in, and outputs from register A1 the address $a_1$ to be accessed. At the same time, address $a_0$ stored in register A1 is transferred to register A3 since the diagram shows a write cycle at the beginning of the nth cycle. The asserted (i.e. high) read/write signal output from register R1 at the beginning of the (n+1)th cycle causes multiplexer 204 to pass address $a_1$ in register A1 to memory 110. No write data is associated with the read operation.

Assuming that the read/write signal applied on the input lead 132 to control register R1 during the (n−1)th cycle represented a write operation, then the address $a_0$ stored in address register A1 during the nth cycle represents the address in memory 110 to which data d0 is to be written. Data d0, data to be written into SRAM 110 at address $a_0$, is applied at the Data I/O port during the nth cycle and is stored in data register D3 on the low-to-high transition of the clock signal at the end of the nth cycle.

SRAM system 100 also includes a comparator 211 having an input bus 212 connected to output port 201 of register A1 and another input bus 213 connected to output port 205 of register A3. Consequently, during the first part of the (n+1)th cycle comparator 211 compares the requested read address $a_1$ (the address stored in register A1) to the address $a_0$ of the location in memory to which data d0 in register D3 will be sent on the next write clock cycle (this location is at the address $a_0$ stored in register A3). When comparator 211 detects that addresses $a_1$ and $a_0$ match, then the read operation is reading from the address $a_0$ (stored in register A3) to which data d0 in register D3 is to be written in the next write operation. The updated data d0 stored in register D3 and corresponding to address $a_0$ in register A3 has not yet been written into memory 110; rather, the updated data d0 is passed to the input port 218 of mux 217.

The output lead 215 of comparator 211 is connected to select lead 216 of multiplexer 217. Multiplexer 217 has an H input port 218 connected by bus 221 to the output port 219 of register D3. Multiplexer 217 has an L input port 220 connected to the Data-Out port of memory 110.

During the read operation in the (n+1)th cycle, if comparator 211 detects that address $a_1$ in register A1 does not match address $a_0$ in register A3, then multiplexer 217 selects the Data-Out port of memory 110 (i.e., data $d_1$ stored in memory 110 corresponding to address $a_1$) and outputs this data on bus 220 through mux 217 and through buffer 140 to the Data I/O bus. However, if comparator 211 detects that address $a_1$ does match address $a_0$ in register A3, then during the (n+1)th cycle, multiplexer 217 passes the output signals d0 on buses 221 and 218 from the data out port 219 of register D3 to the Data I/O bus through buffer 140.

Referring to FIGS. 2 and 3, a write operation is performed as follows. In this example, the read/write signal (i.e. R/W*) is deasserted (i.e. taken low) during the (n+1)th cycle to indicate a write operation is to take place in the (n+2)th cycle. On the next transition of the clock signal from low-to-high at the end of the (n+1)th cycle and the beginning of the (n+2)th cycle, register R1 receives, stores and outputs the deasserted read/write signal. Consequently, a low signal on the select input line 208 of multiplexer 204 causes mux 204 to pass on bus 207 to the address port of SRAM 110 the output signals on bus 205 representing the address $a_0$ stored in register A3 (which is the address in SRAM memory 110 to which the data d0 stored in register D3 as a result of the previous write operation during the nth cycle is to be written).

Write enable circuit 210 controls the actual writing of data into SRAM 110. Circuit 210 is enabled by the deasserted (i.e. low) write signal as is register D3, thereby causing memory 110 to receive at the Data-In port, the data signals d0 on buses 221 and 218 from register D3 on the next low clock signal (SRAM 110 is enabled by write enable circuit 210 to write data d0 on the low clock signal during cycle (n+2)). During cycle (n+2) the data d0 in register D3 will be written into the location in memory 110 defined by the address $a_0$ in register A3. Also, during cycle (n+2), register A1 receives, stores and outputs the address $a_2$ to which to-be-received data $d_2$ applied to the Data I/O terminal during the (n+2)th cycle is to be written in SRAM 110 on the next write cycle.

Pulse circuit 210 provides a delayed self timed high-low-high pulse after a low-to-high clock signal after waiting the required time to receive the stored deasserted read/write signal from register R1 via a line 200. This pulse causes memory 110 to store at the address $a_0$ (received from register A3 via multiplexer 204) the data d0 received at the Data-In port of memory 110. The Data-In port of memory 110 is connected by buses 218 and 221 to the output port 219 of register D3, which outputs data d0 (the data from the previous write operation associated with address $a_0$ ).

In addition, during the (n+2)th cycle, data $d_2$ is applied to the Data I/O terminal and thus to the input port of register D3. Data $d_2$ corresponds to address $a_2$ loaded in register A1 during the low-to-high transition of the clock signal signifying the end of the (n+1)th cycle and the beginning of the (n+2)th cycle. During the (n+2)th cycle, the read/write signal is asserted (i.e. goes high) to indicate that a read operation associated with address $a_3$ will take place during cycle (n+3).

At the end of cycle (n+2), on the low-to-high transition of the clock signal, register D3 stores data $d_2$ associated with address $a_2$. Address $a_2$ in register A1 is transferred to register A3 also at the end of cycle (n+2).

In the same manner as described above, the read/write signal asserted during the end of cycle (n+2) is stored in register R1 on the low-to-high transition of the clock signal at the start of cycle (n+3). Register R1 provides the asserted read/write signal on output lead 200 to disable pulse circuit 210, on output lead 200-2 to disable data register D3 and on output lead 200-1 to disable address register A3. Thus, on the low-to-high transition of the clock signal at the start of the (n+4)th cycle, address $a_2$ remains in address register A3.

Then, during the cycle (n+3), the read/write signal is deasserted (i.e. goes low), thereby indicating the start of another write operation during upcoming cycle (n+4). Thus, during cycle (n+4) the output signal from register R1 is low thus enabling pulse circuit 210. Pulse circuit 210 provides a pulse to write data $d_2$ from register D3 into the location in memory 110 at address $a_2$ in address register A3 during cycle (n+4) a delayed time after the low-high transition of the clock signal.

Referring back to cycle (n+2), during this cycle the read/write signal is asserted, thereby indicating a read operation. This read operation sequentially follows a write operation. (i.e., bus turnaround), which would result in a lost cycle in conventional synchronous SRAMs because the conventional synchronous SRAM must write the data into the main memory before this data can be read during the read operation. However, in memory circuit 100, the operation of comparator 211 and multiplexer 217 provides the data requested by the read operation (specified by an address $a_3$ in register A1) if this data is $d_2$ (the address $a_2$ to which this data $d_2$ is to be written is stored in register A3 at the start of cycle (n+3)) without first writing this data $d_2$ into memory 110, thereby eliminating the lost cycle. Accordingly, an SRAM memory system 100 will have higher system bandwidth relative to the conventional synchronous SRAM system because there is no lost cycle on bus turnaround.

Figure 4:
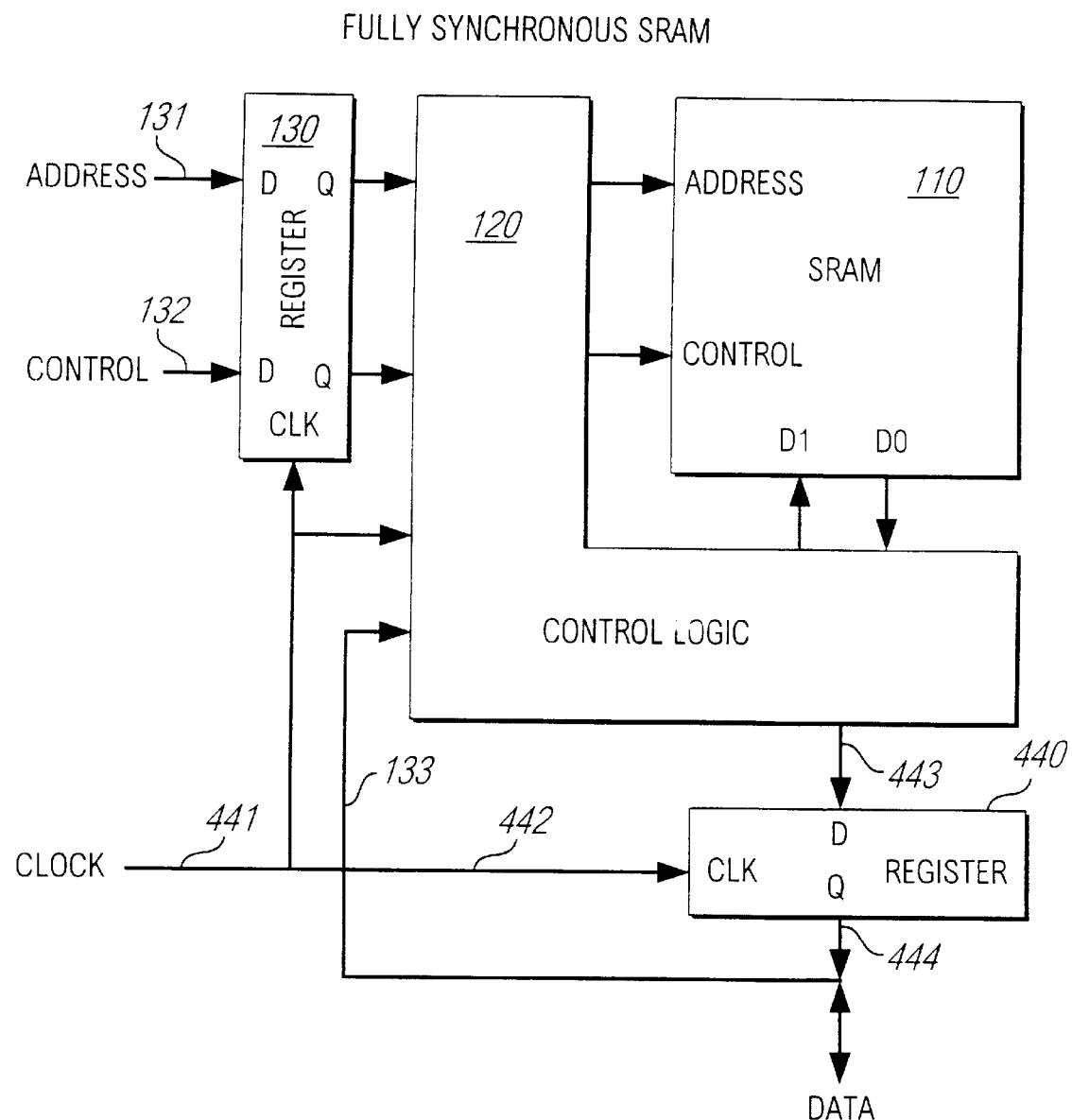
FIG. 4 shows a block diagram of another embodiment of the present invention using a two-stage pipeline.

FIG. 4 shows a block diagram of another embodiment of the present invention. In the embodiment of FIG. 4 each of the elements disclosed therein is identical to the elements disclosed in FIG. 1 with the exception that buffer 140 has been replaced by register 440. Register 440 allows the fully synchronous SRAM of this invention to be used in the system with two pipeline delays as opposed to the single pipeline delay system shown in FIG. 1. Thus, an output signal from SRAM 110 is passed through control logic 120 on bus 443 to register 440 and there stored to be read out of register 440 on bus 444 in response to a clocking signal brought to register 440 on leads 441 and 442 from an external clock (not shown) on the next following clock cycle. The remainder of the structure shown in FIG. 4 at the level of abstraction depicted is identical to that shown in FIG. 1 and operates in essentially the same manner as described above in conjunction with FIGS. 1, 2 and 3 but with two cycle delays associated with data to be written into SRAM 110 and with additional registers and logic required to implement the two-stage pipeline delay.

Figures 1, 7:
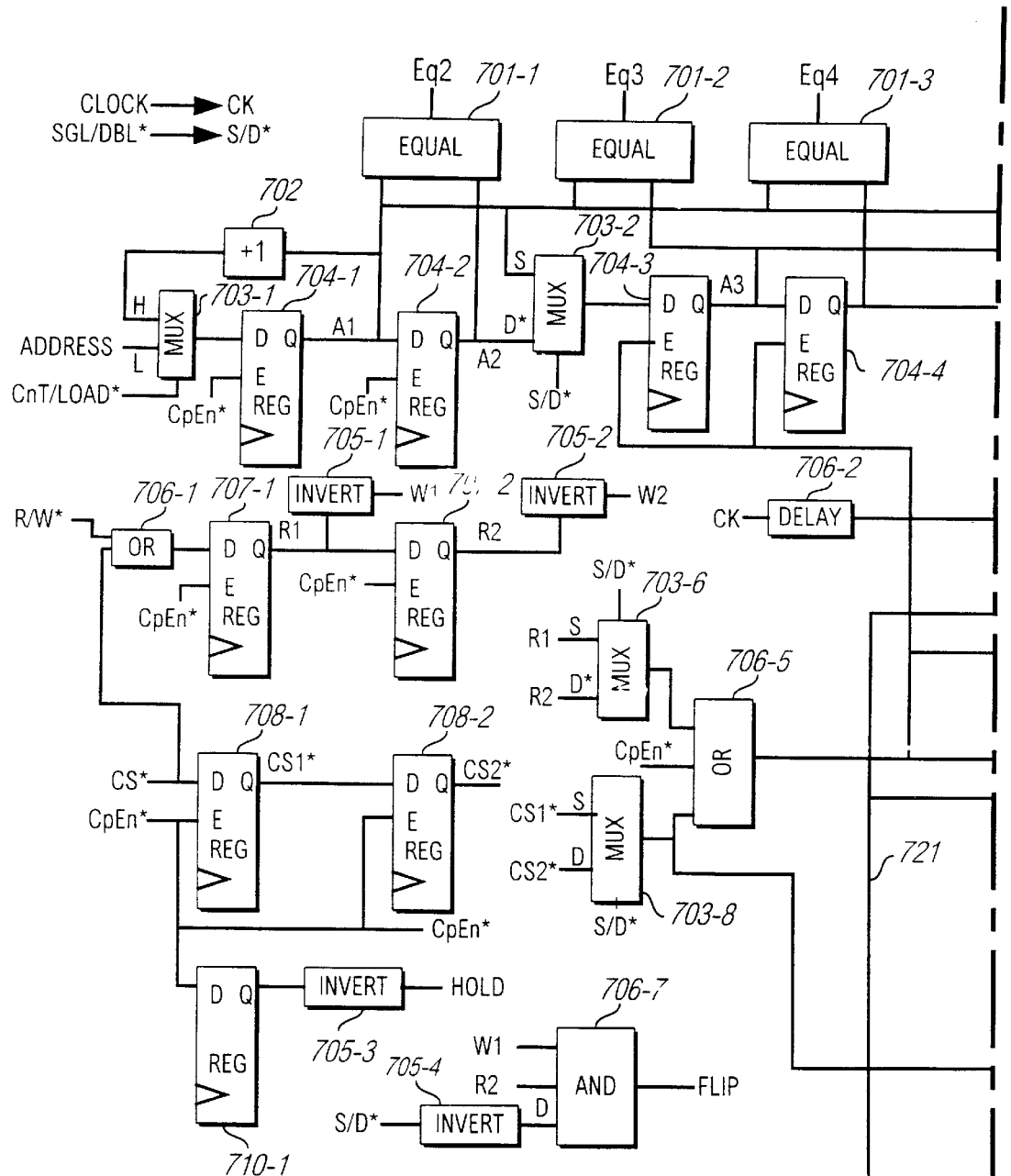
FIG. 7 (comprising sheets 7-1 and 7-2) shows a schematic block diagram of an embodiment of the present invention capable of operating in either a single pipeline or two-stage pipeline configuration.
Figures 2, 7:
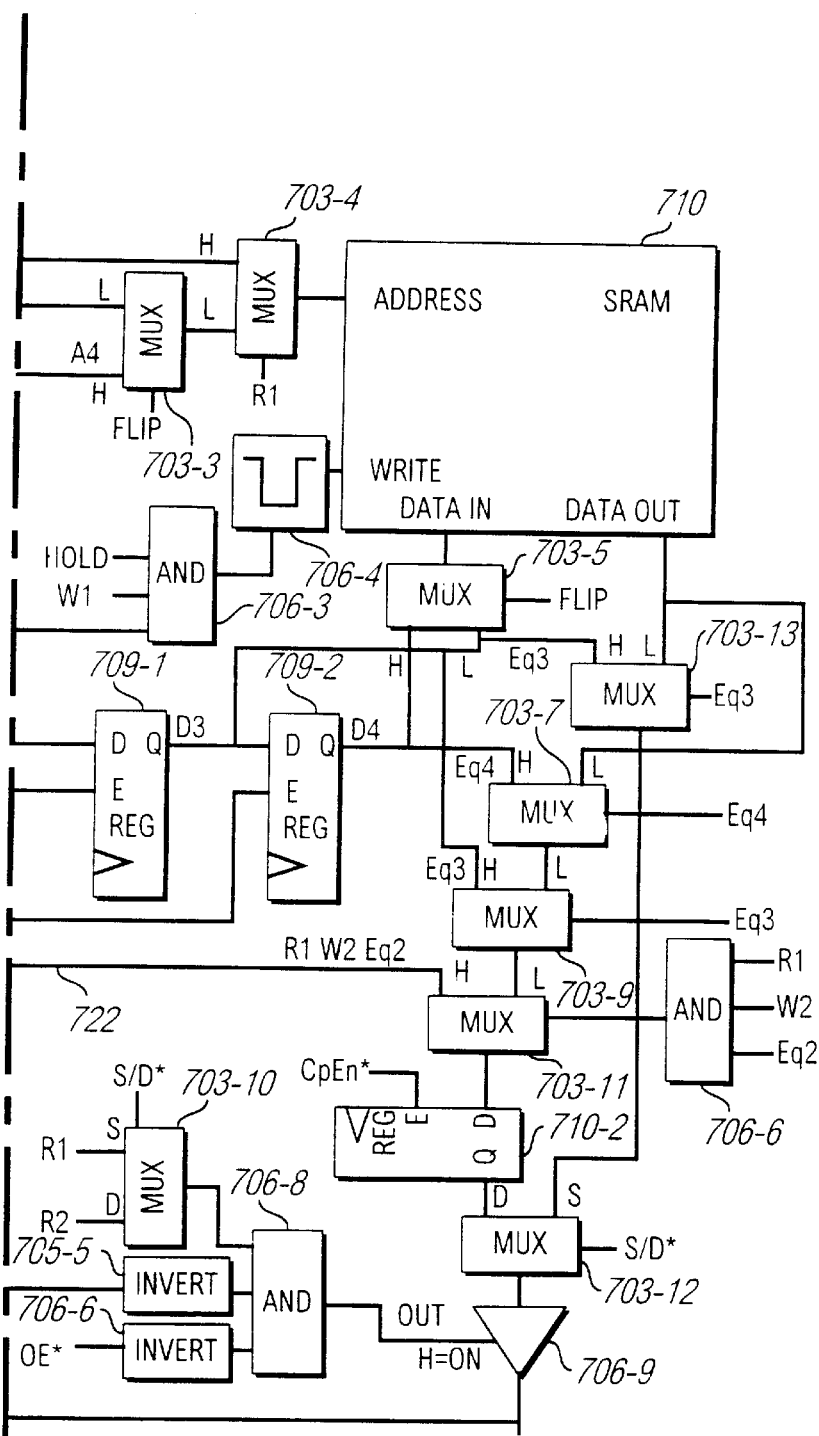
Figure 7:
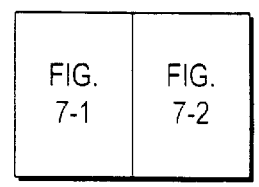

FIGS. 5A, 5B, and 5C, respectively, illustrate the double pipeline read sequence for reading information from the memory of FIG. 7, the double pipe write sequence for writing information into the memory at a specified address, and an illustrative double pipe read and write sequence as applied over a period of clock cycles illustrated as 0–8 (FIG. 5C).

As shown in FIG. 5A, the double pipe read requires the presence on the input bus to the first address register of an address containing information to be read on the first cycle, the read out from the SRAM of the information at the specified address in the SRAM in the second cycle and then, on the third clock cycle, the storage of this data in a system register and the reading out from the system register of this data.

The double pipe write shown in FIG. 5B requires the presence on the input bus to an address register of an address of the location in memory to which data is to be written on the first cycle, a delay for the second cycle during which time the address on the input bus is transferred into the address register. This is followed by a third cycle during which write data to be written into the memory is applied to the input bus of a first data register. This data is written into the first data register in the system on the fourth cycle.

FIG. 7 illustrates a fully synchronous SRAM system utilizing the principles of this invention. As a feature of this circuit, read and write cycles can be intermixed without bus turnaround cycles for a read cycle following a write cycle. Edge triggered registers (i.e. registers which load signals previously applied to their input buses on a low-to-high clock signal transition) are used to store address, data and control signals. The unique bus turnaround capability of this invention is achieved using internal edge-triggered flip flops and various gating and controlling logic.

In the single pipeline delay mode, read data to be output from the system is available at the Data I/O bus on the next clock cycle after the read address and control signals are presented to the input leads. A separate asynchronous output structure is available to solve high speed timing problems on read cycles should such problems arise.

Data for write cycles is presented to the Data I/O bus on the cycle following the cycle in which the address and control signals are presented to the address input bus and the control signal input bus, respectively. Thus, whether read or write, the data signals are always one cycle delayed from address and control signals. But the address and control signals are applied to the memory simultaneously in proper timing to ensure that the data is written to or read from the proper cells in the memory.

The structure shown in FIG. 7 is particularly useful in very high speed digital applications. For example, digital signal processing memories for recursive or nonrecursive filters or digital integrators can move data on every clock cycle. ATM switches can have access to data cells continuously without dead cycles. High speed cache memory systems can implement read cycles or write cycles on every clock cycle without interruption caused by the memory component. In many high speed applications, this can result in a speed improvement of up to fifty percent (50%), for example.

In the circuit block diagram schematic shown in FIG. 7, the following abbreviations are used.

| NAME | PINS | FUNCTION |
| --- | --- | --- |
| Address | 17 or more | Address inputs. Word select in the SRAM. |
| Data | 8 | Data inputs/outputs. |
| CLK | 1 | Clock input. All operations (except write to SRAM 710) execute on the low-to-high transitions. |
| R/W* | 1 | Read/Write input. |
| CS* | 1 | Chip select input. When active (low), the chip is enabled. When high, the chip is deselected and all functions are disabled. |
| CEN* | 1 | Clock enable input. |
| CpEN | 1 | When active (low), the chip is enabled. When not active (high) all register operations are disabled. Data still appears on the output data bus if the last valid operation was a read and data still appears on the input bus to be written into memory if the last valid operation was a write. |

-continued

| NAME | PINS | FUNCTION |
|------|------|----------|
| OE* | 1 | Output enable input. An asynchronous signal. When low, the output buses are enabled. When high, the output buses are high impedance. |
| Sgl/Dbl* | 1 | When high, the data in or out is delayed by one clock cycle. When low, the data in or out is delayed by two clock cycles. |
| Cnt/Load* | 1 | When low, the address register will load the address presented on the address pins. When high, the address register will load the value currently held in the register as modified by the +1 logic; linear or other mapping. |
| Vdd | 6 | Plus voltage inputs. |
| Vss | 7 | Ground inputs. |

With the above definitions of terms, the schematic block diagram shown in FIG. 7 will now be described. The SRAM system of FIG. 7 has the unique property of being able to read or write on every cycle with no dead cycles. The data, read or write, is always delayed by one or two clock cycles (a function of whether a single clock cycle delay or a two clock cycle delay is used) compared to the address and control signals.

The circuit of FIG. 7 is capable of operating either as a single pipeline structure (one clock cycle delay) or a double pipeline structure (two clock cycle delay). Thus, when the signal SGL/DBL* (denoted as S/D* in FIG. 7) is high, the data in/out is delayed by one clock cycle. When SGL/DBL* is low, the data in/out is delayed by two clock cycles.

In the schematic block diagram of FIG. 7, comparators have been given the numbers 701-i, where i represents a particular comparator, multiplexers have been given the numbers 703-i, where i represents a particular multiplexer, address registers have been given the numbers 704-i where i represents a particular address register, read/write (R/W*) control signal registers have been given the numbers 707-i where i represents a particular control signal register, chip enable registers have been numbered 708-i, and two sets of registers whose uses will be described shortly have been numbered 709-i and 710-i, where i equals 1 or 2. Inverters have been numbered 705-i and logic gates, delays, an edge detector, an output buffer and other miscellaneous components have been given the numbers 706-i. Item 702 is a pulse generator. To avoid cluttering the drawing, leads and terminals have not been numbered.

SINGLE PIPELINE OPERATION

In the single pipeline configuration (i.e. one clock delay version) of the structure of FIG. 7, S/D* is high. The operation of the structure of FIG. 7 in the single pipeline mode (i.e. single clock delay mode) will be explained in light of the timing waveforms of FIG. 8A.

Figure 8A:
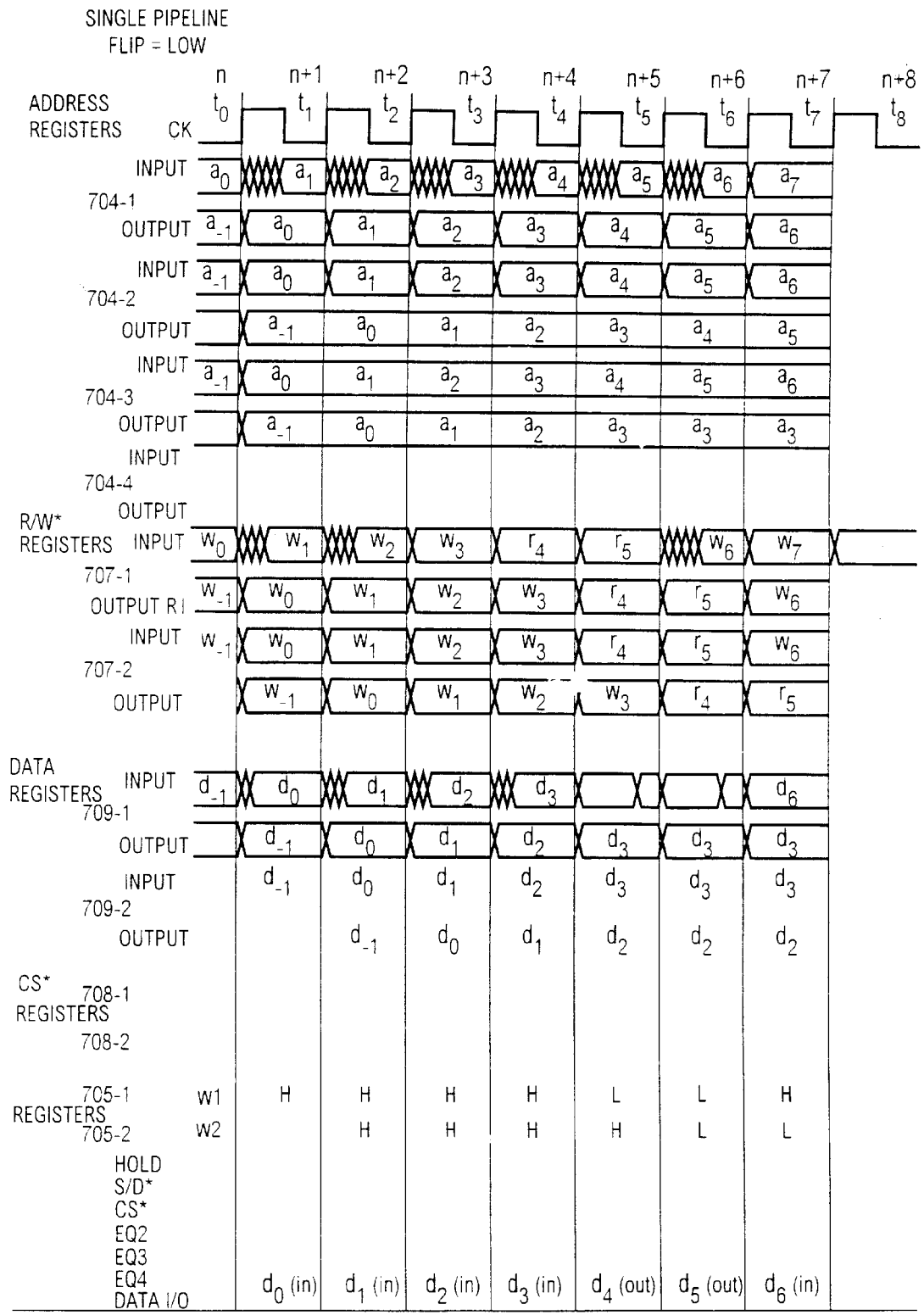
FIGS. 8A and 8B show timing waveforms for two sequences of read/write signals applied to the structure of FIG. 7 operating in the single pipeline mode and dual pipeline mode, respectively.

While time has been shown as starting at $t_0$ in FIG.8A, this choice is arbitrary. In any event, time to should be understood to represent some arbitrary time during the operation of the circuit and not the start time of the circuit. This is shown in FIG. 8A by the notation n, n+1, n+2, ... n+8 placed above the arbitrary times $t_0$, $t_1$, $t_2$, ... $t_8$, respectively to show that FIG. 8A describes the nth through (n+8)th cycles of operation, where n is a selected integer.

Period $t_0$

During period $t_0$ the address signals $a_0$ and the R/W* signal are supplied to appropriate input buses to the circuit. These signals are clocked into address register 704-1 and control register 707-1 on the low-to-high clock transition at the end of period $t_0$ and the start of period $t_1$. During period $t_0$ (and all subsequent time periods of operation of this circuit of FIG. 7) the select input signal Cnt/Load on the select input lead to mux 703-1 is low thereby allowing the address signals $a_0$ applied to the address input bus of mux 703-1 to pass through mux 703-1 to the D input bus of address register 704-1. Register 704-1 is enabled by CpEn* low. Simultaneously OR gate 706-1, enabled by chip select signal CS* low, allows the R/W* signal to pass through OR gate 706-1 to the D input lead into register 707-1.

Mux 703-3 has the FLIP signal applied to its gate. This FLIP signal is low because the signal S/D*, applied to one input lead of inverter 705-4 is high (indicating one clock cycle delay). The output signal from inverter 705-4 is low so long as the system is operating in the single pipeline mode. Therefore the output signal from AND gate 706-7 will be low regardless of the states of the input signals W1 and R2 on the other two input leads to AND gate 706-7.

Similarly, OR gate 706-5 receives input signals on three input leads. The first input lead is connected to the output lead of mux 703-8. Because mux 703-8 is controlled by the high S/D* signal, mux 703-8 passes the CS1* signal through the S input lead. Since CS1* is low, OR gate 706-5 will have a low input signal on the input lead connected to the output lead of mux 703-8. Chip enable signal CpEn*, applied to the middle input lead of OR gate 706-5, is also low to enable the chip containing the circuit of FIG. 7 to operate. The third input lead to OR gate 706-5 is connected to the output lead of mux 703-6. The select input lead of mux 703-6 is driven by the high S/D* signal for the single pipeline mode. The two input leads to mux 703-6 carry the R1 and R2 signals, respectively. Because the low output signal from mux 703-8 and the low CpEn* signal enable OR gate 706-5, the signal passed by mux 703-6 is transferred through OR gate 706-5 to the output lead of OR gate 706-5. This signal, depending on whether it is low or high enables or disables, respectively, data registers 709-1 and 709-2 and address registers 704-3 and 704-4. When R1 is high, the output signal from OR gate 706-5 is high and when R1 is low the output signal from OR gate 706-5 is low. R1 is low only when a write signal is stored in control register 707-1. Thus, the output signal from OR gate 706-5 enables data storage registers 709-1 and 709-2 and address registers 704-3 and 704-4 only when the R1 signal is low indicating a write.

Referring to FIG. 8A as well as FIG. 7, the particular address $a_0$ to which data d0 will be written is stored in register 704-1 on the rising edge of the clock signal between time period $t_0$ and time period $t_1$, one clock cycle before the data d0 associated with address $a_0$ is applied to the Data I/O lead of the circuit.

During time period $t_0$, a write signal w-1 is shown as stored in register 707-1.

Period $t_1$

If the R/W* signal is a write signal (i.e. low) during time $t_0$, then the output lead R1 of register 707-1 will have a low level signal during period $t_1$. The output signal W1 from inverter 705-1 will be high during period $t_1$.

The output address signal $a_0$ at address register 704-1 is applied to the H input bus of multiplexer 703-4. However the select input of mux 703-4 is driven by the low R1 signal from register 707-1 and therefore the address signal $a_0$ applied to the H input bus of mux 703-4 is not passed through mux 703-4.

On the low-to-high transition of the clock signal at start of period $t_1$, data $d_{-1}$ is transferred into data register 709-1.

During period $t_1$, a new address $a_1$ is applied to the input bus to register 704-1. Simultaneously, data d0 is applied through the Data I/O pin to the input bus to data register 709-1. Register 709-1 is enabled to receive and store data by the low write signal R1 on the Q output lead of control register 707-1 (corresponding to the signal w0 in FIG. 8A) applied through the S input lead of mux 703-6 to one input lead of OR gate 706-5 to produce a low enable signal on the enable input leads E of data registers 709-1 and 709-2 and address registers 704-3 and 704-4. At the low-to-high transition of the clock signal between periods $t_0$ and $t_1$, the control signal in register 707-1 during period $t_0$ is transferred to register 707-2. The output signal on the Q output lead from register 707-2 is inverted in inverter 705-2 to yield output signal W2 which is high or low depending on the state of register 707-2.

The address a-1 in register 704-1 during period $t_0$ is transferred to address registers 704-2 and 704-3 during the low-to-high transition of the clock signal at the start of period $t_1$. This latter transfer occurs through the S input bus of mux 703-2, the select input signal to which is S/D* which is high for the single pipeline mode of operation. The states of the select inputs on muxes 703-3 and 703-4 remain as they were during period $t_0$.

Mux 703-3 passes the output address a-1 on the Q output bus from register 704-3 and on the L input bus to mux 703-3 to the L input bus of mux 703-4 (selected by signal R1 from control register 707-1 being low) and from there to the address port of memory 710. Thus, the address of memory 710 to which data $d_{-1}$ in data register 709-1 will be written is a-1. Simultaneously, the low FLIP signal is applied to the select input lead of mux 703-5, the output bus of which is connected to the Data-In port of memory 710. Consequently mux 703-5 passes the data signal d_from data register 709-1 to the L input bus of mux 703-5. Because W1 is high when R1 is low and HOLD is high (HOLD is the inverted low output signal on the Q output lead from register 710-1, the input signal to which is low CpEn*), AND gate 706-3 is enabled. The output signal from AND gate 706-3 goes high in response to the delayed clock signal being applied to one input lead of AND gate 706-3 through delay 706-2. This clock signal causes write enable circuit 706-4 to produce a low pulse to enable the write input to SRAM 710. Consequently during the period $t_1$, the data $d_{-1}$ is read into and stored at the location in SRAM memory 710 given by address a-1 because the control signal in register 707-1 during time $t_0$ is a write signal w-1.

Period $t_2$

On the low-to-high transition of the clock signal at the end of period $t_1$ and the start of period $t_2$, address $a_1$ is entered into register 704-1 and address $a_0$, previously in register 704-1, is transferred to registers 704-2 (a "don't care") and 704-3, replacing the address a-1 formerly in these two registers. Simultaneously, write signal w1 is stored in control register 707-1. Data d0 is transferred into data register 709-1 and data $d_1$ which corresponds to the address $a_1$ stored in address register 704-1, is placed on the input bus to data register 709-1 from Data I/O terminal. Data $d_{-1}$ is transferred from register 709-1 to register 709-2 (a "don't care").

During period $t_2$ the clock signal is transmitted through delay 706-2 and, since HOLD and W1 are both high, causes AND gate 706-3 to cause write enable circuit 706-4 to enable SRAM 710 to write into memory the data d0 stored in data register 709-1 at the address $a_0$ stored in address register 704-3. Address $a_0$ stored in address register 704-3 is transmitted to the address port of SRAM 710 on the L input bus of mux 703-3 and the L input bus of mux 703-4.

Thus, by the end of period $t_2$, data d0 has been placed in memory 710 at the address $a_0$, and data $d_1$, corresponding to address $a_1$ placed in address register 704-1 at the start of period $t_2$, has been placed on the input bus to data storage register 709-1.

Period $t_3$

At the start of the next time period $t_3$, the data $d_1$ is transferred into data storage register 709-1 and the data d0 previously in this data register is transferred to data register 709-2 (a "don't care"). During period $t_3$, data $d_1$ is transferred into SRAM memory 710 through the L input bus of mux 703-5 to the Data-In port of memory 710 and stored in memory 710 at the address $a_1$ stored in register 704-3 during the low-to-high transition of the clock signal at the start of period $t_3$. Address $a_1$ is transmitted through the L input bus of mux 703-3 and the L input bus of mux 703-4 into the address port of memory 710 to control the location to which the data $d_1$ in data register 709-1 is written.

Period $t_4$

On the low-to-high transition of the clock signal at the start of period $t_4$, data $d_1$ is transmitted into data register 709-2 (a "don't care") replacing the data d0 previously in that register. Simultaneously control signal W3 is placed in control register 707-1 and the control signal W2 previously in register 707-1 is transferred to control register 707-2. Thus, signals R1 and R2 remain low reflecting the write control signals stored in registers 707-1 and 707-2, respectively. Data $d_2$ is transferred into data register 709-1 replacing the data $d_1$ simultaneously transmitted into data register 709-2. The address $a_2$ previously in address register 704-1 is transferred into address registers 704-2 (a "don't care") and 704-3. The address $a_2$ is transmitted through the L input bus of mux 703-3 to the L input bus of mux 703-4 to the address port of SRAM 710. Simultaneously, data $d_2$ in data register 709-1 is transmitted through the low input bus of mux 703-5 to the Data-In port of SRAM 710. Thus, data $d_2$ will be written to address $a_2$ in SRAM 710 upon the low write enable signal from enable circuit 706-4 being applied to the write enabled port of SRAM 710 during period $t_4$.

Address $a_4$ is placed on the input bus to address register 704-1 and R/W* signal $r_4$, denoting a read operation, is placed on the input bus to control register 707-1 during period $t_4$. The Q output lead of register 707-1 still carries a low level signal because write signal w3 is stored in register 707-1 and W1 from inverter 705-1 remains high. W2 remains high because the previous low write signal w2 is transferred into control register 707-2 causing the output signal W2 from inverter 705-2 to remain high. The R1 input signal on the S input lead to mux 703-6 remains low thereby enabling data registers 709-1 and 709-2 and address registers 704-3 and 704-4.

Period $t_5$

On the low-to-high transition of the clock signal at the start of period $t_5$, address $a_4$ is transferred into address register 704-1 and address $a_3$ previously in this register is transferred into address registers 704-2 (a "don't care") and 704-3. Data $d_3$ is passed into data register 709-1 and write signal $r_4$ is transferred into control register 707-1 thereby causing signal R1 to go high. Thus, the signal W1 from inverter 705-1 goes low. The write signal $r_4$ in control register 707-1 causes mux 703-4 to select the signals on the H input bus for transfer to the output bus connected to the address port of SRAM 710. Thus, the address $a_3$ stored in address register 704-3 is not transferred to the address port of SRAM 710. Rather, the address a4 stored in address register 704-1 is transmitted through the H input bus of mux 703-4 to the address port of SRAM 710.

Because a read control signal is now stored in control register 707-1, a read operation is to be carried out during time period $t_5$. If the address $a_4$ stored in address register 704-1 does not equal the address $a_3$ stored in address register 704-3, then the output signal Eq3 from comparator 701-2 will be low. Thus, mux 703-13 will be activated to pass the data out at the address $a_4$ in SRAM 710 through the L input bus of mux 703-13 to the S input bus of output mux 703-12 activated by the high level signal S/D*. This output signal will then be transmitted through output buffer 706-9 to the Data I/O pin.

The signal R1 going high passes through mux 703-6 on the S input lead and then through OR gate 706-5 to cause OR gate 706-5 to produce a high level output signal thereby disabling data registers 709-1 and 709-2 and address registers 704-3 and 704-4. Consequently, at the start of the next time period, these registers will be disabled and will retain the contents which they held during period $t_5$.

Should, however, the address $a_4$ equal the address $a_3$ stored in address register 704-3, Eq3 will be high. High Eq3 will cause the data $d_3$ in data register 709-1 to be transmitted through the H input bus of mux 703-13 and from there to the S input bus of mux 703-12 to the output buffer 706-9 and from there to the Data I/O port. Thus, the data stored in data register 709-1 does not have to be written into SRAM 710 when address $a_4$ equals address $a_3$ but rather can be read out of the system to the Data I/O bus.

Address signal $a_5$ and control signal $r_5$ are applied to the input bus and lead, respectively, of address register 704-1 and control register 707-1.

Period $t_6$

On the low-to-high transition of the clock signal at the start of time period $t_6$, address $a_5$ is loaded into address register 704-1. Address $a_4$ previously in this register is transferred to address register 704-2 (a "don't care"). Address $a_3$ previously in address register 704-3 remains in address register 704-3, because register 704-3 has been disabled by a high level output signal from OR gate 706-5.

Simultaneously, read control signal $r_5$ is loaded into control register 707-1 and the previous read control signal $r_4$ in register 707-1 is transferred to register 707-2. Thus, signal R1 is high and signal W1 is low. Because OR gate 706-5 produced a high level output signal during period $t_5$, data register 709-1 is disabled. Thus, throughout period $t_6$ data register 709-1 retains the data $d_3$ previously placed in that register at the start of time period $t_5$.

Control signal $r_5$ indicates that a read of the data at address $a_5$ is to be carried out on SRAM memory 710 during period $t_6$. Address as from register 704-1 is transmitted through the H input bus of mux 703-4 selected by R1 being high to the address port of SRAM 710. If address $a_5$ does not equal address $a_4$ in data register 704-2, then the signal Eq2 from comparator 701-1 will be low. If $a_5$ does not equal $a_3$ stored in data register 704-3, the signal Eq3 will also be low. Thus, the data in SRAM 710 at address $a_5$ will be transmitted through the Data Out port and through the L input bus of mux 703-13 to the S input bus of mux 703-12 and from there through output buffer 706-9 to the Data I/O bus from the system.

If, however, the address $a_5$ equals the address $a_3$ stored in data register 704-3, then the output signal Eq3 from comparator 701-2 will be high. Eq3 high will cause the data $d_3$ stored in data register 709-1 to be transmitted through the H input bus of mux 703-13 to the S input bus of mux 703-12 and from there through buffer 706-9 to the Data I/O port. Buffer 706-9 is enabled during period $t_6$ as it was during period $t_5$ by the high R1 output signal from control register 707-1.

Address $a_6$ and control signal w6 are applied to the input bus and input lead, respectively, of address register 704-1 and storage register 707-1.

Period $t_7$

On the low-to-high transition of the clock signal at the start of period $t_7$, address $a_6$ is loaded into address register 704-1. Address $a_5$ previously in address register 704-1 is loaded into address register 704-2. However address $a_3$ previously in address register 704-3 remains in address register 704-3 because this register has been disabled by the high output signal from OR gate 706-5.

Simultaneously, write control signal w6 is transferred into control register 707-1. Read signal $r_5$ previously in control register 707-1 is transferred to control register 707-2. Thus, the signal R1 goes low and W1 goes high enabling AND gate 706-3.

The control signal w6 means a write operation is now to be carried out on SRAM memory 710. However, the last write data to be placed in data register 709-1 is data $d_3$. This data has yet to be written to SRAM 710. The address $a_3$ to which this data $d_3$ should be written is still stored in address register 704-3 which has been disabled by the two high level read signals during periods $t_5$ and $t_6$. Thus, during period $t_7$ the address $a_3$ is transmitted from address register 704-3 through the L input bus to mux 703-3 to the L input bus of mux 703-4 selected by the signal R1 being low, and thus to the address port of SRAM 710. Simultaneously, the signal $d_3$ in data register 709-1 is transmitted on the L input bus of mux 703-5 to the data in port of SRAM 710. The clock signal passed through delay 706-2 and AND gate 706-3 during cycle $t_7$, enables data $d_3$ to be written into SRAM 710 to the address $a_3$ at the address port of SRAM 710.

Period $t_8$ and Subsequent Periods

The system operation during period $t_8$ and subsequent periods will be as described above with the data to be written into or read from memory always appearing on the Data I/O bus one cycle after the address to which this data is to be written or from which it is to be read, appears on the input bus to the address register 704-1.

Thus, the system operates to eliminate the one cycle delay during the reading of data from the memory caused by the need to store in the memory the data to be written into the memory before the same data can be read from the memory during a read operation immediately following a write operation.

Figure 7A:
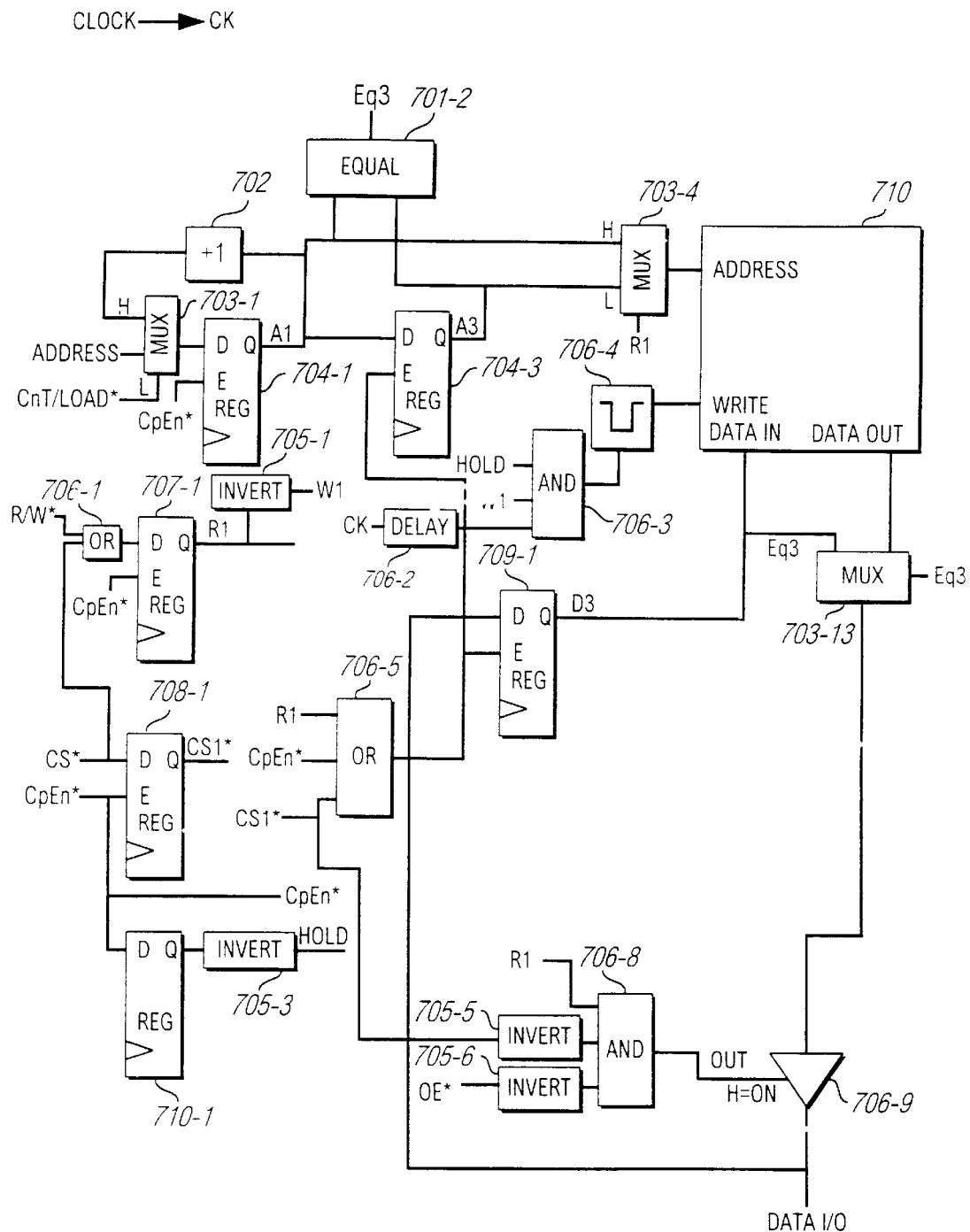
FIGS. 7A and 7B (comprising sheets 7B-1 and 7B-2) show the embodiment of FIG. 7 modified for single stage pipeline and two-stage pipeline operation, respectively.

FIG. 7A illustrates the structure of FIG. 7 where all unnecessary elements in the logic block diagram of FIG. 7 have been removed to implement the single pipeline operation of the structure of FIG. 7. The operation of the structure of FIG. 7A is as described above in conjunction with FIG. 7.

DOUBLE PIPELINE OPERATION

The double pipeline operation is characterized by S/D* going low. Thus, the signal FLIP from AND gate 706-7 will be high or low depending on the states of signals W1 and R2. Contrary to the single pipeline operation described above, where the signal FLIP was always low because the signal S/D* was always high, FLIP will change from high to low depending on the states of the control signals in control registers 707-1 and 707-2.

Figure 8B:
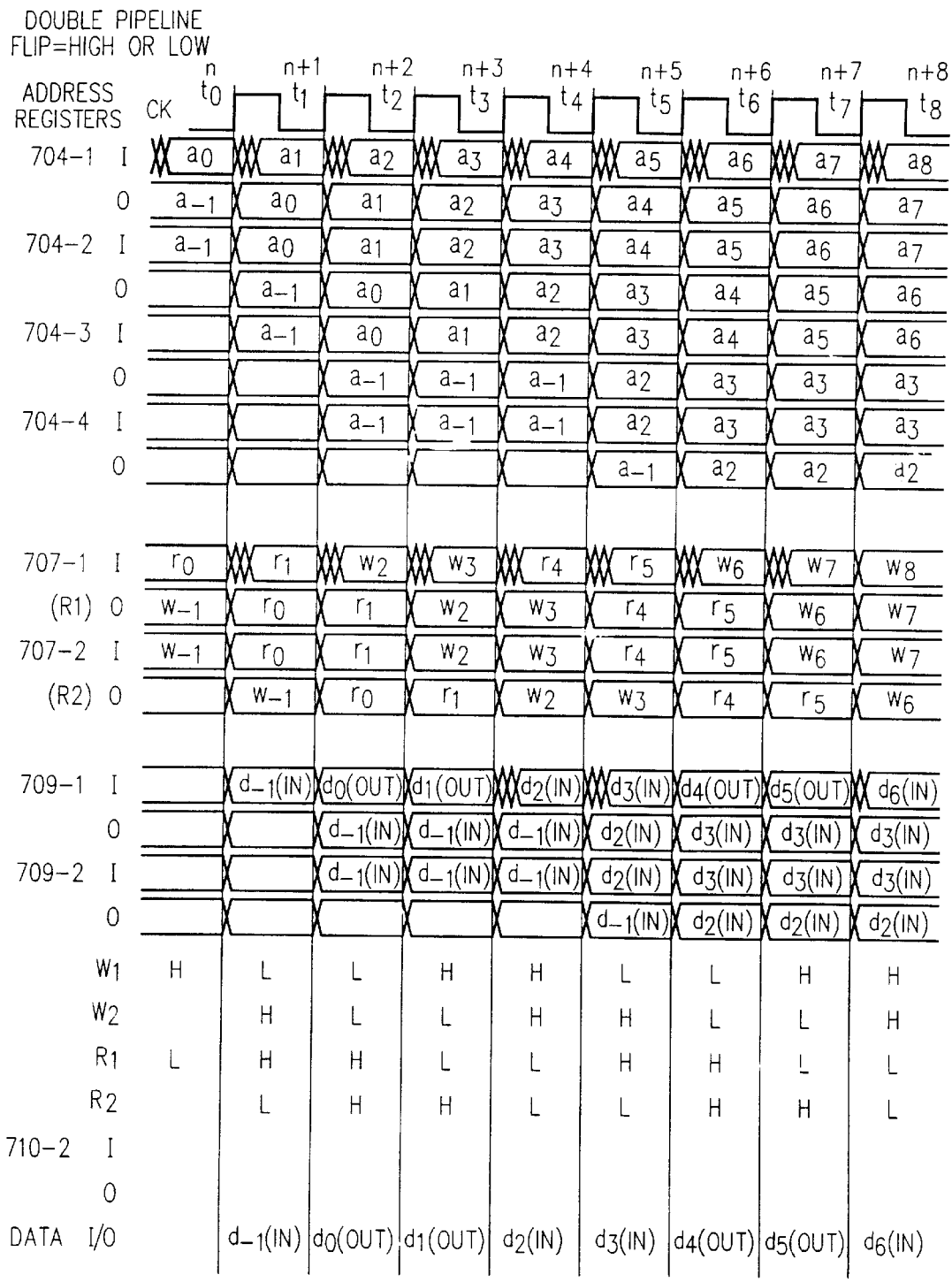

Also, as with FIG. 8A, while the time periods in FIG. 8B are shown as starting at time $t_0$, this choice is arbitrary and for convenience only. Time $t_0$ represents some arbitrary time (characterized as the nth cycle) during the operation of the circuit and not the start time of the circuit. As with FIG. 8A, times $t_1$, $t_2$, . . . $t_8$ correspond to cycles n+1, n+2, . . . n+8 where n is an arbitrary integer.

Period $t_0$

Referring to FIGS. 7 and 8B, during period $t_0$, address $a_0$ is applied to the input bus to address register 704-1. Simultaneously a read control signal $r_0$ is applied to the input lead of control register 707-1. The signal S/D* is low. Accordingly, an input signal on the D* input bus to mux 703-2 is passed to the output bus of mux 703-2. The output bus of mux 703-2 is connected to the D input bus of address register 704-3.

Period $t_1$

On the low-to-high transition of the clock signal CK at the start of period $t_1$, address signal $a_0$ is transferred into address register 704-1. Simultaneously address a-1, already in address register 704-1, is transferred to address register 704-2.

At the same time, the read control signal R/W*, shown in FIG. 8B as $r_0$, on the input lead to control register 707-1, is transferred into control register 707-1. The write control signal w-1 in control register 707-1 during period $t_0$ is transferred to control register 707-2. Thus, the R1 and R2 signals are high and low, respectively, and the W1 and W2 signals are low and high, respectively. During period $t_1$, because the signal W1 is low and the signal R2 is low, even through the D input signal to AND gate 706-7 is high, the signal FLIP is low.

The low S/D* signal causes mux 703-2 to transmit the address a-1 in register 704-2 on output bus Q to the D* input bus of mux 703-2 and through mux 703-2 to the D input bus of address register 704-3.

The control signal $r_0$ is stored in register 707-1. The control signal $r_0$ is high meaning that information is to be read from SRAM 710 during time period $t_1$. To do this, the address signal $a_0$ in address register 704-1 is applied to the H input bus of mux 703-4. Mux 703-4 has the high level signal R1 on its select input lead and thus passes address $a_0$ to the address port of SRAM 710. The data stored at the location in SRAM 710 given by address $a_0$ is then passed to the Data Out port of SRAM 710 and to the low input bus of mux 703-7. Mux 703-7 passes this data to the low input bus of mux 703-9 which in turn passes this data to the low input bus of mux 703-11. The select inputs of muxes 703-7 and 703-9 both have low signals thereby activating their low input buses. The output signal from AND gate 706-6 is low because Eq2 is low meaning comparator 701-1 produces a low output signal. Thus, mux 703-11 passes the data being read out of SRAM 710 to the D input bus of output register 710-2. This data is then read into register 710-2 on the low-to-high transition of the clock signal at the end of period $t_1$ and the start of period $t_2$. Thus, during period $t_2$ the data being read out of SRAM 710 will be applied to the D input bus of mux 703-12 and from this D input bus to the output bus from mux 703-12 (S/D* is low thereby enabling this path). Because during period $t_2$ the signal R2 will be high, this data will be passed during period $t_2$ from buffer 706-9 (enabled by a high output signal from AND gate 706-8 reflecting the high level signal R2) to the Data I/O terminal from which this data will be sent to its destination.

Address signal $a_1$ and read control signal $r_1$ are applied to the input bus and input lead, respectively, of address register 704-1 and control register 707-1.

Period $t_2$

At the start of period $t_2$, the low-to-high transition of the clock signal causes the address $a_1$ applied to the input bus of address register 704-1 to be stored in address register 704-1. Simultaneously, the address $a_0$ previously stored in address register 704-1 is stored in address register 704-2. The control signal $r_1$ indicating that the information stored at address $a_1$ is to be read out of SRAM 710, is read into control register 707-1. The control signal $r_0$ previously in register 707-1 is read into control register 707-2. Thus, the signals W1 and W2 are both low and the signals R1 and R2 are both high. The data d0 read out from SRAM 710 during period $t_1$ and placed on the input bus D to output register 710-2 is transferred into output register 710-2 and transferred on the Q output bus from register 710-2 to the D input bus of mux 703-12. As described above under period $t_1$, this data d0 is then passed from the D input bus of mux 703-12 through mux 703-12 enabled by the S/D* signal being low, to and through output buffer 706-9 enabled by the high level output signal from AND gate 706-8. The data d0 being output from the memory is passed through buffer 706-9 to the Data I/O port and sent from there to its destination.

Simultaneously, the address $a_1$ in register 704-1 is passed to the H input bus of mux 703-4. Because the select input of mux 703-4 is driven high by signal R1, this address $a_1$ is passed to the address port of SRAM 710. The information $d_1$ located in SRAM 710 at address $a_1$ is then passed through the Data Out port from SRAM 710 to the L input bus of mux 703-7 and through mux 703-7 to the L input bus of mux 703-9. Both muxes 703-7 and 703-9 have low input signals on their select inputs and thus pass this data $d_1$ to the L input bus of mux 703-11. This mux also has a low input signal on its select lead and thus passes the data $d_1$ through mux 703-11 to the D input bus of register 710-2.

Address signal $a_2$ is applied to the input bus of address register 704-1 while write control signal w2 is applied to the input lead of control register 707-1.

Period $t_3$

At the low-to-high clock transition at the start of period $t_3$ the address $a_2$ which has previously been placed on the input bus to address register 704-1 during period $t_2$, is loaded into address register 704-1. Simultaneously, the control signal w2 applied to the D input lead of control register 707-1 is loaded into control register 707-1. The signal $r_1$ previously in control register 707-1 is loaded into control register 707-2. Thus, the signals W1 and W2 become high and low, respectively, and the signals R1 and R2 become low and high, respectively. At the low-to-high clock transition at the start of time $t_3$, the data $d_1$ on the D input bus to register 710-2 (read out from the address location $a_1$ during the previous period $t_2$) is transferred into register 710-2 and made available through mux 703-12 and output buffer 706-9 to the Data I/O port.

Address signal $a_3$ and write control signal w3 are applied to the input bus and input lead, respectively, of address register 704-1 and control register 707-1.

Period $t_4$

The control signal w2 in register 707-1 during period $t_3$ means that in period $t_4$ data $d_2$ will be applied to the Data I/O bus and to the D input bus of register 709-1. This data $d_2$ will be written into SRAM 710 at the address given by w2 during a subsequent write period.

On the low-to-high transition of the clock signal at the start of period $t_4$, the write control signal w3 is placed in register 707-1 and the address $a_2$ specifying the location in memory 710 at which data $d_2$ is to be stored is transferred from address register 704-1 to address register 704-2. The control signal w2 is transferred from control register 707-1 to control register 707-2. During this period, read signal $r_4$ is applied to the input terminal of control register 707-1 and the address signal $a_4$ is applied to the input bus of address register 704-1. During this period, the data $d_2$ is applied to the Data I/O bus and to the D input bus of data register 709-1.

Period $t_5$

On the low-to-high transition of the clock signal at the start of period $t_5$, the control signal $r_4$ is stored in control register 707-1, address $a_4$ is stored in address register 704-1 and data $d_2$ is stored in data register 709-1. Output signal R1 from register 707-1 is high. Output signal W1 from inverter 705-1 is low. Control register 707-2 stores the write signal w3. Thus, output signal W2 from inverter 705-2 is high because w3 is low. However, the output signal from mux 703-6 remains low because the signal R2 is low. Data registers 709-1 and 709-2 along with address registers 704-3 and 704-4 are disabled. In addition, AND gate 706-3 is disabled when signal W1 goes low thereby preventing information from being written into SRAM 710. Data $d_3$ is applied to the Data I/O bus; data $d_3$ corresponds $t_0$ address $a_3$ applied two cycle previously to the input bus of address register 704-1.

The address $a_4$ stored in address register 704-1 depicts the location in SRAM 710 at which information $d_4$ is to be read out from SRAM 710. Because R1 is high, this address is supplied directly through the H input bus of mux 703-4 to the address port of SRAM 710. Simultaneously, this address $a_4$ is compared in comparator 701-1 to the address $a_3$ stored in register 704-2 and also in comparator 701-2 to the address $a_2$ stored in address register 704-3. Should the address $a_3$ stored in address register 704-2 equal the address $a_4$ stored in address register 704-1, then Eq2 goes high. When Eq2 goes high, AND gate 706-6 produces a high output signal enabling mux 703-11. Data $d_3$ on the input Data I/O bus (corresponding to data $d_4$ to be read out of memory 710) is passed through mux 703-11 to the D input bus of register 710-2. If Eq3 goes high indicating address $a_2$ matches address $a_4$, then data $d_2$ stored in register 709-1 (corresponding to data $d_4$ to be read out of memory 710) is transmitted to the H input bus of mux 703-9 enabled by Eq3 being high, and through mux 703-9 to the low input bus of mux 703-11 (enabled by Eq2 low causing the output signal of AND gate 706-6 to be low) and to the D input bus of register 710-2.

Address signal as and read control signal $r_5$ are applied to the input bus and input lead, respectively, of address register 704-1 and control register 707-1. Data $d_3$ is applied to the Data I/O bus.

Period $t_6$

At the end of period $t_5$ and the beginning of period $t_6$, address as on the input bus to address register 704-1 is transferred into register 704-1 on the low-to-high transition of the clock signal. Address $a_5$ is then applied to the input bus of address register 704-2. During period $t_5$, a read signal $r_5$ was applied to the input lead of control register 707-1. This read signal $r_5$ is then transferred into control register 707-1 on the low-to-high transition of the clock signal at the beginning of period $t_6$. The read control signal $r_4$ in control register 707-1 is transferred to register 707-2. Thus, both signals W1 and W2 go low. Data $d_3$ is transferred into data register 709-1 and data $d_2$ is transferred from register 709-1 into data register 709-2 on the low-to-high transition of the clock signal.

Address register 704-3, however, has been enabled by the low level signal from OR gate 706-5 generated by R2 being low during period $t_5$. Accordingly, the address $a_3$ on the input bus to address register 704-3 during period $t_5$ is transferred to address register 704-3 at the beginning of period $t_6$ and the address $a_2$ on the input bus to address register 704-4 during period $t_5$ is transferred to address register 704-4 at the beginning of period $t_6$.

A read operation is to take place during time period $t_6$. The information stored in SRAM 710 at address $a_5$ is to be read from the system.

Should the address as not equal the address $a_3$ stored in register 704-3 or the address $a_4$ stored in register 704-2, then the address $a_5$, transmitted to the H input bus of mux 703-4 and from there to the address port of SRAM 710, will determine the address within SRAM 710 at which the information $d_5$, to be read from the memory, is located. This information, $d_5$, will then be read out of SRAM 710 through the Data Out port and through the L input bus of mux 703-7, the L input bus of mux 703-9, the L input bus of mux 703-11 to the input bus of register 710-2. This data $d_5$ will be transferred into register 710-2 on the low-to-high clock transition at the start of period $t_7$. Note that the comparators 701-1, 701-2 and 701-3 all produce low output signals Eq2, Eq3 and Eq4, respectively.

If, however, address $a_5$ in address register 704-1 equals address $a_3$ in address register 704-3, then, comparator 701-2 produces a high level output signal Eq3. A high level signal Eq3 indicates that the data $d_5$ to be read out from the memory system is stored in data register 709-1. This data is read out from register 709-1 through the H input bus of mux 703-9, the L input bus of mux 703-11, to the D input bus of register 710-2 and is stored in register 710-2 on the low-to-high transition of the clock signal at the start of period $t_7$.

If the address $a_5$ in register 704-1 equals the address $a_4$ stored in register 704-2, then the signal Eq2 goes high. However, the address $a_4$ does not correspond to data being read into the system but rather corresponds $t_0$ a read signal $r_4$. Accordingly, no data is present in storage register 709-1 or 709-2 corresponding to the address $a_4$ and the address $a_5$ is transmitted directly to the address input port of SRAM 710 through the H input bus of mux 703-4.

Thus, in both periods $t_5$ and $t_6$, which correspond to read operations, the data $d_3$ stored in data register 709-1 during period $t_6$, identified by the address $a_3$ in address register 704-3 during period $t_6$ and by the address $a_3$ in address register 704-2 during period $t_5$, is read directly out of data register 709-1 when the address stored in address register 704-1 matches the address stored in address register 704-3. The data $d_3$ is read from the Data I/O bus when the address $a_4$ stored in register 704-1 matches the address $a_3$ stored in register 704-2 during period $t_5$.

The address signal $a_6$ and write control signal w6 are applied to the input bus and input lead, respectively, of address register 704-1 and control register 707-1. Data $d_4$ corresponding to the information at or to be placed at address $a_4$ in memory 710 is placed on the Data I/O.

Period $t_7$

On the low-to-high transition of the clock signal CK at the start of period $t_7$, address $a_6$, located on the input bus to address register 704-1 during period $t_6$, is transferred into and stored in address register 704-1. Simultaneously, the address $a_5$ previously stored in address register 704-1 is transferred to address register 704-2. During period $t_6$, R2 was high. Thus, data registers 709-1 and 709-2 and address registers 704-3 and 704-4 were disabled. These registers are also disabled during time period $t_7$. Consequently, the data $d_3$ in data register 709-1 and the data $d_2$ in data register 709-2 during period $t_6$ remain in place in these registers on the low-to-high clock signal transition at the start of period $t_7$. In addition, the addresses $a_3$ and $a_2$ in address registers 704-3 and 704-4, respectively, likewise remain in place. Thus, during period $t_7$, write signal w6 is stored in control register 707-1 while read signal $r_5$ is stored in control register 707-2. Thus, a write operation is to take place and the data to be written into SRAM 710 is the data $d_2$ associated with the address $a_2$ stored in address register 704-4. This data $d_2$ is stored in register 709-2. Because both R2 and W1 are high, the FLIP signal from AND gate 706-7 is high. Thus, mux 703-5 provides the data from the Q output bus of data register 709-2 through the H input bus of mux 703-5 to the Data In port of SRAM 710. Meanwhile the address $a_2$ stored in register 704-4 is provided through the H input bus of mux 703-3 to the L input bus of mux 703-4 to the address port of SRAM 710. The L input bus of mux 703-4 is activated by the low level signal R1 on the select input of mux 703-4.

As shown in FIG. 8B, a write signal w6 had been applied to the input lead of control register 707-1 during period $t_6$. This write signal w6 is now stored in control register 707-1. Thus, output signal R1 goes low causing signal W1 to go high. R2 is still high thereby still disabling data registers 709-1 and 709-2 and address registers 704-3 and 704-4. Because address register 704-3 had previously been disabled during period $t_6$, the address $a_5$ on the input bus to address register 704-3 is not stored in address register 704-3. Rather, address $a_3$ previously in address register 704-3 during period $t_6$ remains stored in this register. Data $d_3$ likewise remains stored in data register 709-1 for the same reason. The signal W1 goes high on the low-to-high clock transition at the beginning of period $t_7$, thereby causing AND gate 706-3 to produce a high output signal which enables write circuit 706-4 to cause the writing of information into SRAM 710 when the clock signal goes high to enable circuit 706-4 during period $t_7$. Thus, during period $t_7$, a write signal is generated by write enable circuit 706-4 which causes the data $d_2$ stored in data register 709-2 to be transmitted through the H input bus of mux 703-5 to the Data In port of SRAM 710 and stored at the address $a_2$ applied to the address port of SRAM 710 through the L input bus of mux 703-4 and the H input bus of mux 703-3 from the Q output bus of address register 704-4.

Address signal $a_7$ and write control signal w7 are applied to the input bus and input lead, respectively, of address register 704-1 and control register 707-1.

Period $t_8$

On the low-to-high transition of the clock signal at the start of period $t_8$, address $a_7$ on the input bus of register 704-1 is stored in register 704-1. Address $a_6$ in register 704-1 during period $t_7$ is transferred to and stored in register 704-2. Registers 704-3 and 704-4, however, are still disabled by the high level signal R2 transmitted through OR gate 706-5. Therefore, registers 704-3 and 704-4 continue to hold the addresses $a_3$ and $a_2$, respectively. The data in data registers 709-1 and 709-2 likewise remains $d_3$ and $d_2$ respectively. The signal w7 on the input lead to control register 707-1 during period $t_7$ is transferred into control register 707-1. Signal $w_6$, previously in control register 707-1, is transferred to control register 707-2. The signals R1 and R2 become low. Consequently, the FLIP signal from AND gate 706-7 changes from high to low and thereby enables the L input bus of mux 703-5. Consequently, the data $d_3$ in data register 709-1 is transferred through the L input bus of mux 703-5 to the Data In port of SRAM 710. Simultaneously, the address $a_3$ stored in address register 704-3 is transmitted through the L input bus of mux 703-3 to the L input bus of mux 703-4 thereby to the address port of SRAM 710. Consequently, the data $d_3$ is stored in SRAM 710 at the address $a_3$ during period $t_8$.

As can be seen from the above description, in the dual pipeline version of the invention, data to be written into the memory is applied to the Data I/O two clock periods after the write signal associated with that data is applied to the control circuit. Thus, a read signal immediately following a write signal occurs before the data associated with that write signal even appears on the Data I/O port. The data read out from the SRAM memory during the next cycle will be stored in a register prior to being transmitted on the second following clock cycle to the Data I/O port. Thus, the Data I/O port will at all times either have input data being transmitted into the system or output data being transmitted from the system. The system basically allows data being written into the system to be held in suspense during the reading out of data from the system. The reading out of data from the system causes the addresses of the two sets of data being written into the system but still in the double pipeline to be checked to determine if the data being read out is one of these two pieces of data. If it is, the system automatically reads out the correct data from a temporary storage register; if it is not, the system automatically reads out the correct data from SRAM 710.

Figures 1, 7B:
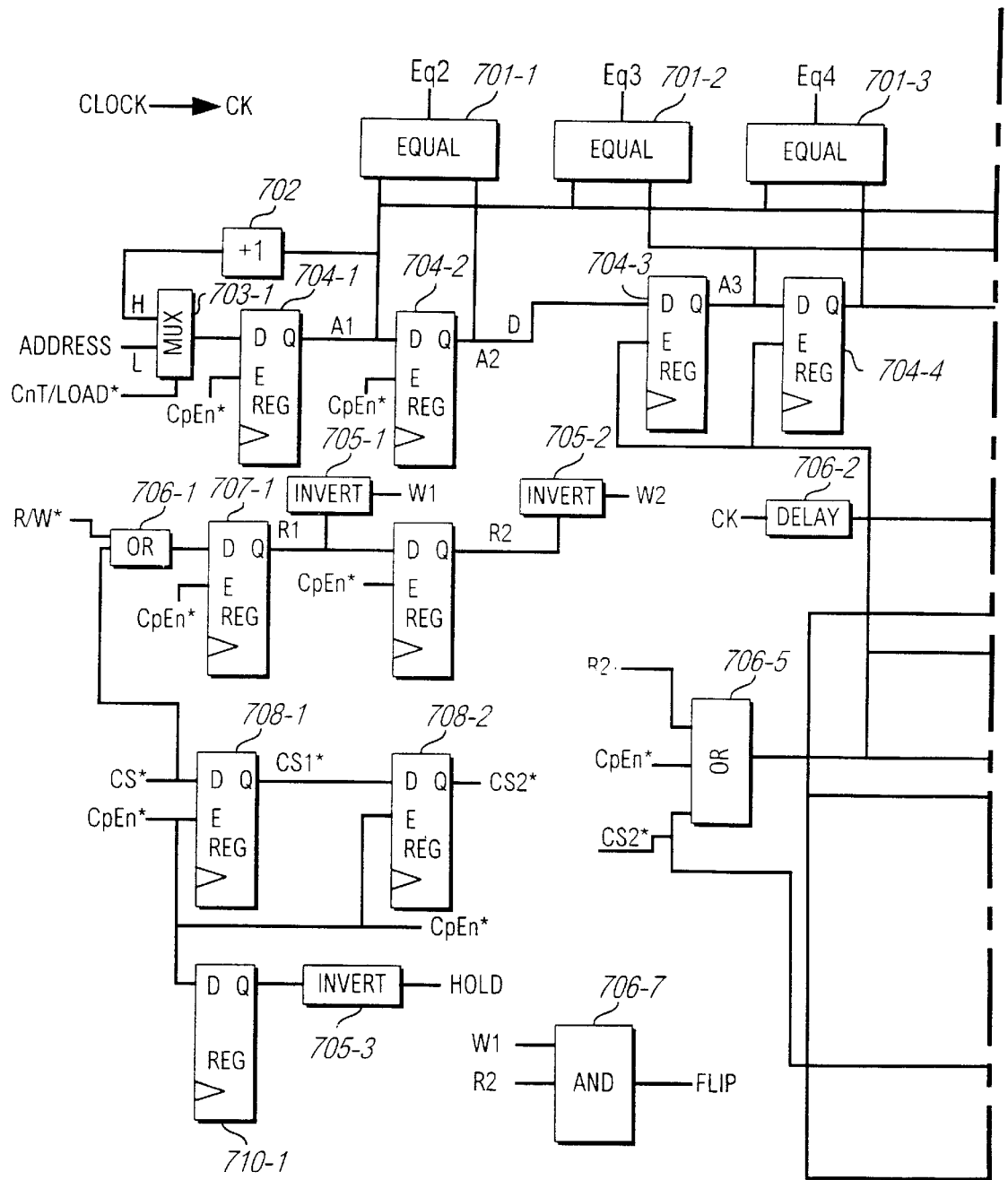
Figures 2, 7B:
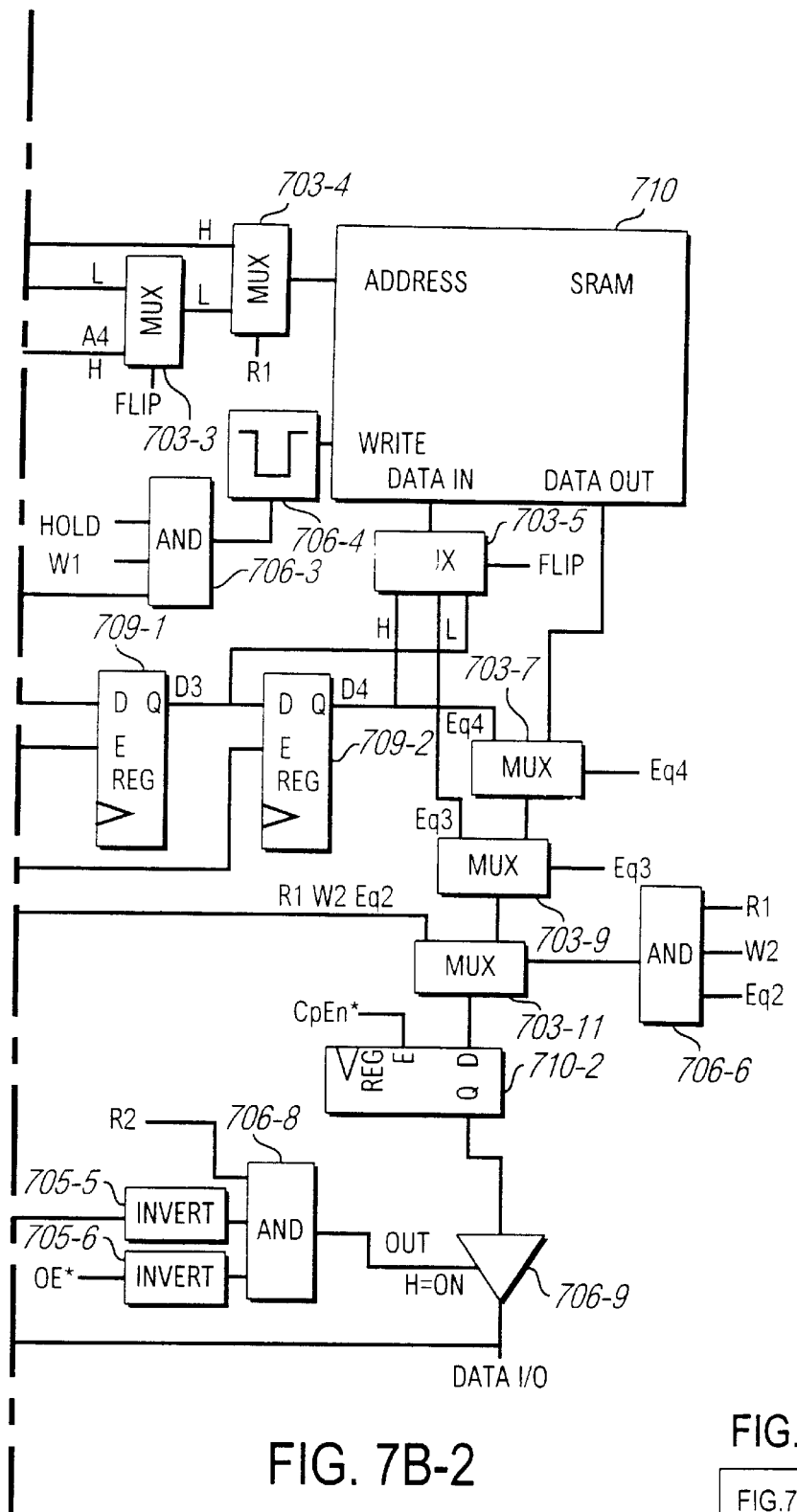

FIG. 7B illustrates the components of FIG. 7 which are required to implement the double pipeline version of this invention. The operation of the structure in FIG. 7B is as described above in connection with the double pipeline operation of the structure shown in FIG. 7. The elements in FIG. 7B are numbered identically to the corresponding elements in FIG. 7.

INTEGRATED CIRCUIT EMBODIMENT

Figure 9A:
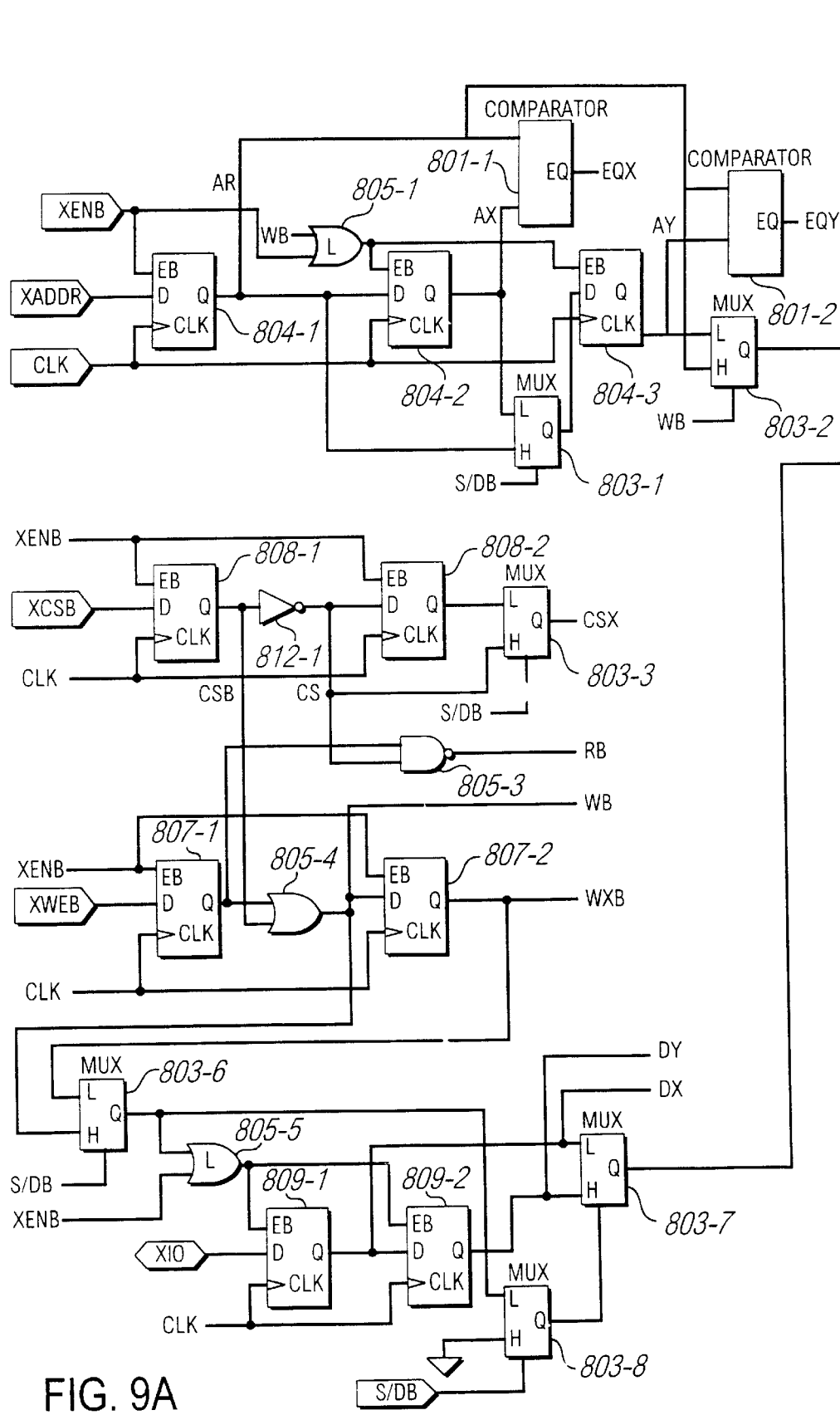
FIG. 9 (comprising sheets 9A and 9B) shows an embodiment of this invention suitable for implementation in an integrated circuit chip.
Figure 9B:
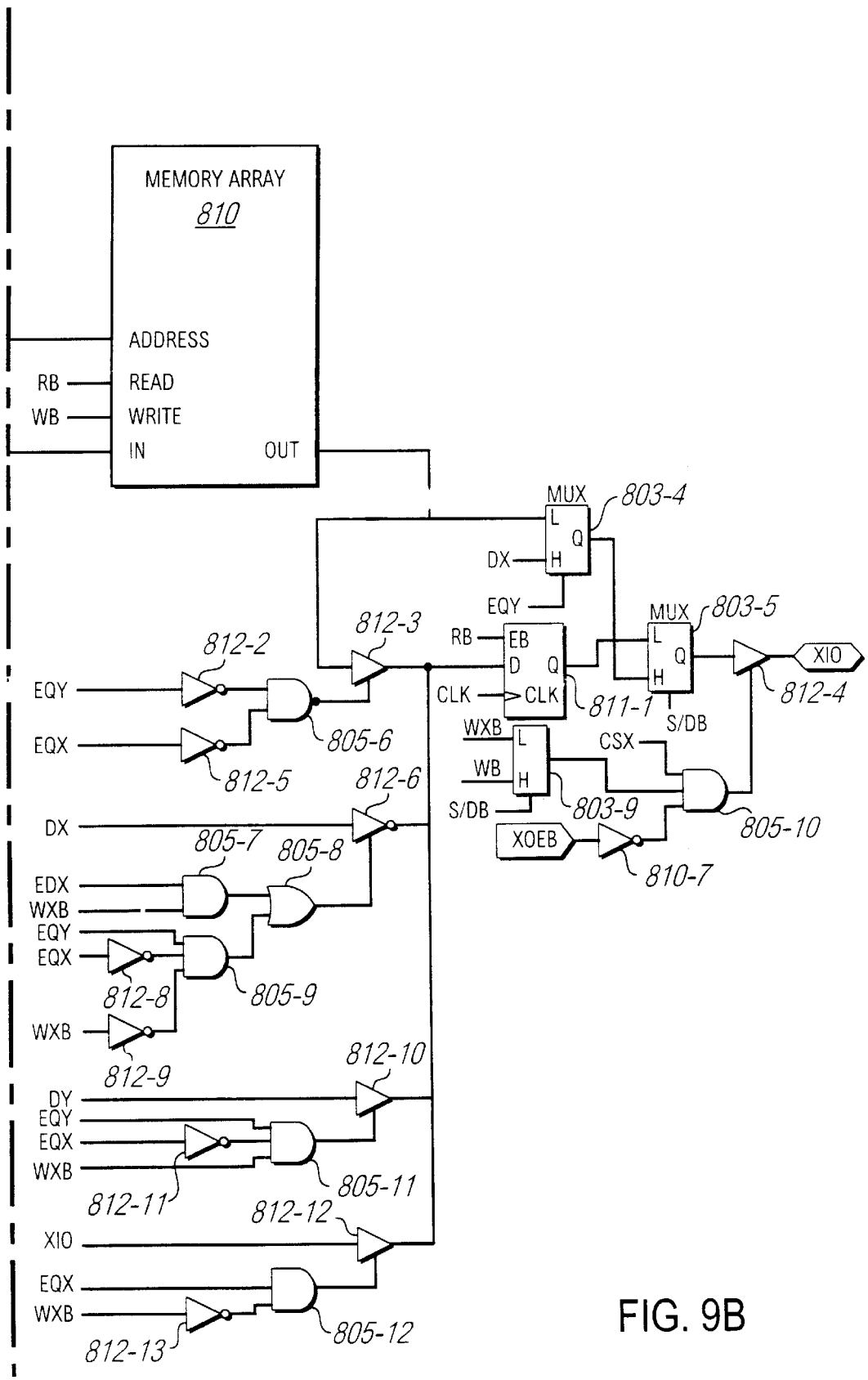
Figure 10A:
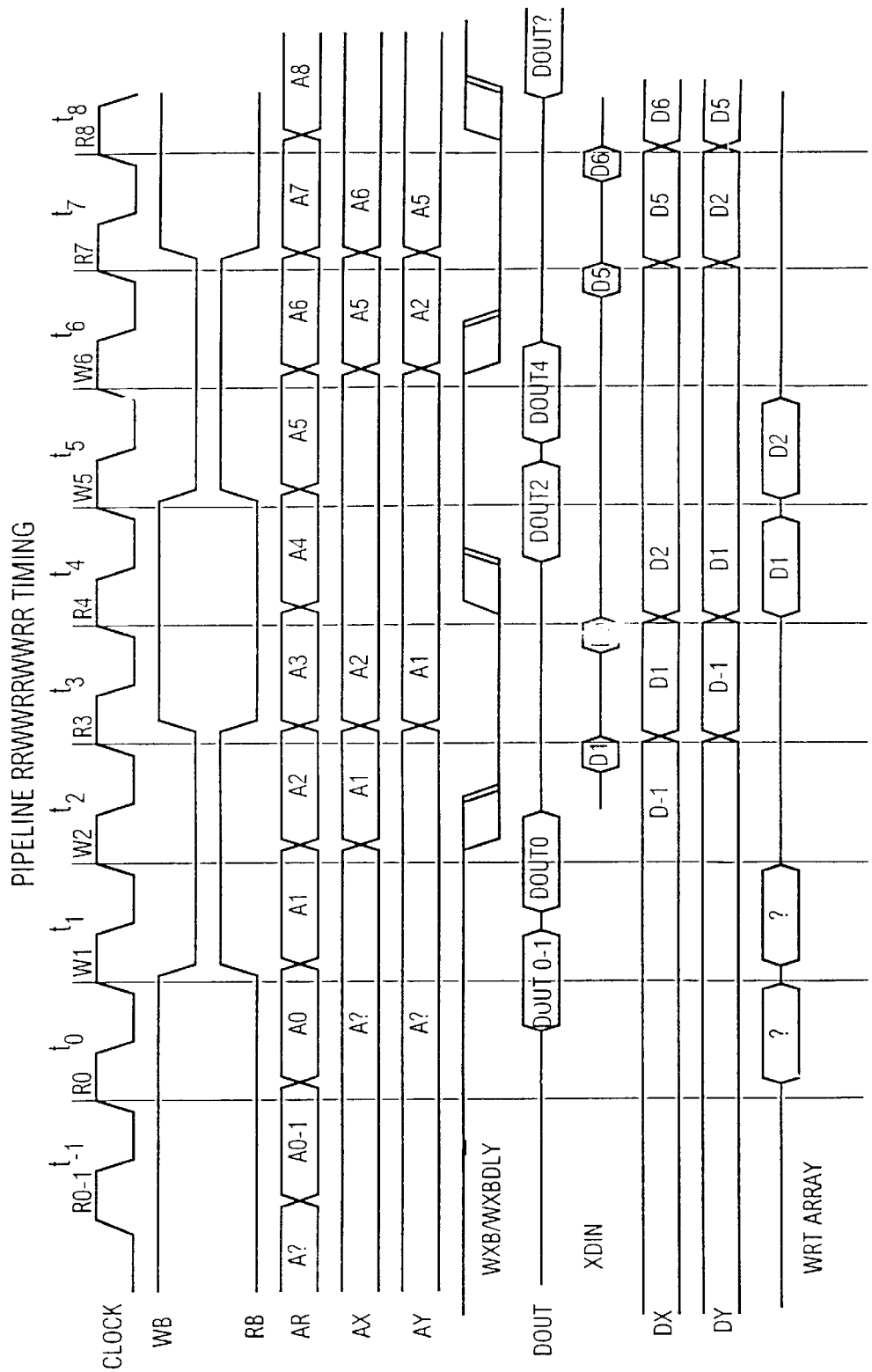
FIGS. 10A and 10B show timing waveforms illustrating the operation of the embodiment of FIG. 9 in the two-stage pipeline mode for two different sequences of read/write signals.
Figure 10B:
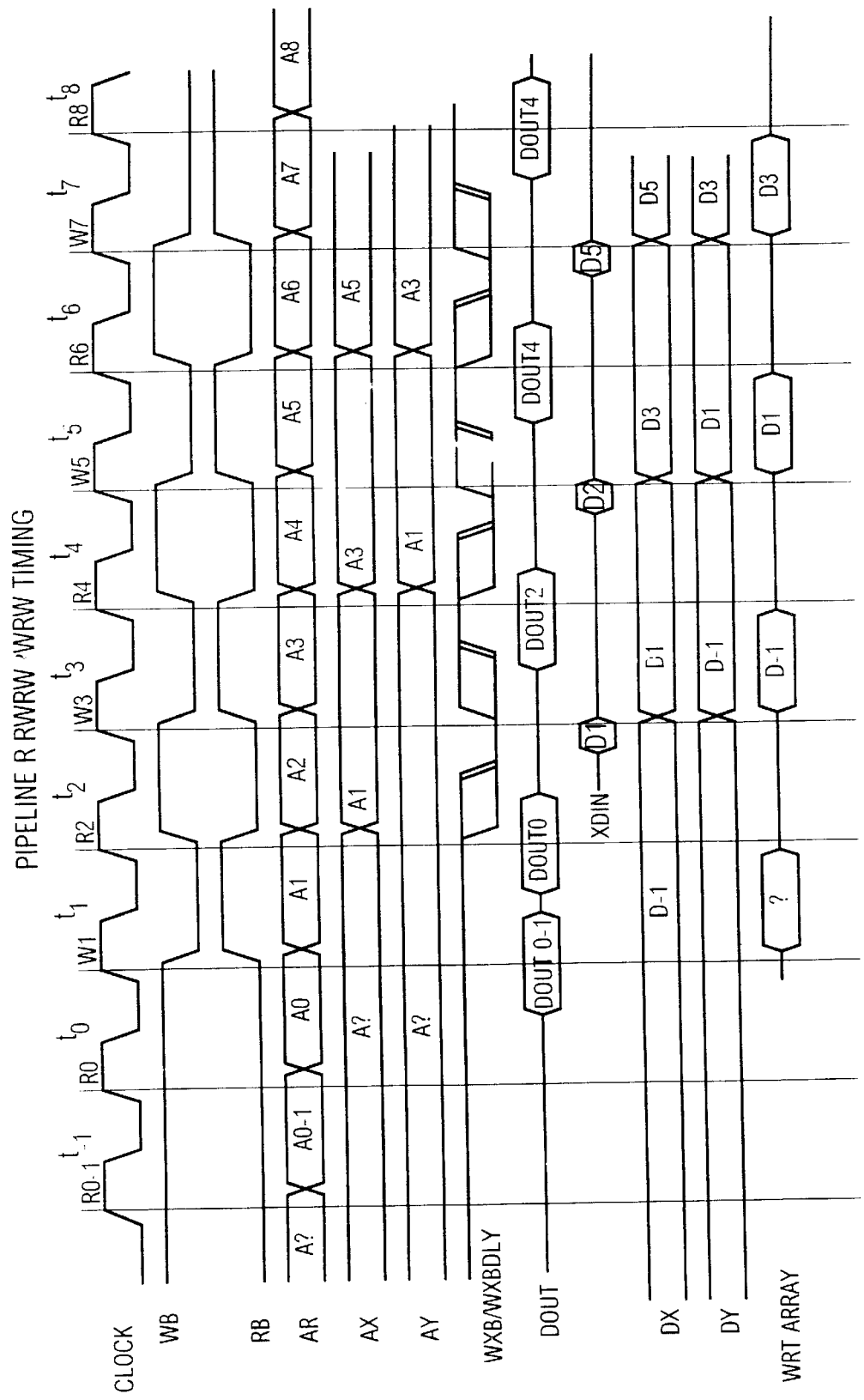

FIG. 9 shows the structure of this invention as implemented in the preferred embodiment incorporated in a semiconductor integrated circuit chip. The waveforms shown in FIGS. 10A and 10B illustrate the operation of the embodiment of this invention shown in FIG. 9 in the dual pipeline mode for two sequences of operations. In FIG. 10A the sequence of read read write write read read write write read read is described. In FIG. 10B the sequence of read write read write read write read read is described. Naturally, in operation, any sequence of read and write signals can be applied to the circuit. The waveforms shown in FIGS. 10A and 10B are merely illustrative of two possible sequences of such read and write signals.

Turning to FIG. 9, the signals depicted in FIG. 9 are as follows:

| | | |
|---|---|---|
| XENB | = | Enable signal (Low to enable) |
| XADDR | = | Address |
| CLK | = | Clock |
| S/DB | = | Single Pipeline (high)/Double Pipeline (low) |
| XWEB | = | Write (low)/Read (high) |
| XIO | = | Data signals, Input/output |
| XCSB | = | Chip Select - Low to Select |
| EQX | = | Comparator - last address - AX to AR |
| EQY | = | Comparator - Second to last address AY to AR |
| DX | = | Last data received |
| DY | = | Second to last data received |
| XOEB | = | Output buffer enable signal |
| AX | = | Address in register 804-2 |
| AY | = | Address in register 804-3 |
| WXB | = | Output signal from control register 807-2 |
| Dout | = | Data out from memory array 810 |
| XDin | = | Data In to System |
| WB | = | output signal from register 807-1 |
| RB | = | Inverted output signal from register 807-1 |

XENB is low to enable operation of the system.

Time Period $t_0$

At the beginning of time $t_0$ (an arbitrary time during the operation of the system picked solely for illustrative purposes), on the low-to-high transition of the clock signal, the address $a_0$ is transferred into the address register 804-1. Simultaneously, the control signal XWEB, corresponding to a read, is transferred into control register 807-1. The chip select signal XCSB (not shown in FIG. 10A), which is low to select a particular chip, is applied to the D input lead of and is thus stored in register 808-1. The output signal CSB from register 808-1 is passed to one input lead of OR gate 805-4 and thus CSB when low enables this OR gate to pass the Q output signal from register 807-1. CSB is also passed through inverter 812-1 which, when CSB is low, produces a high level signal CS which enables the NAND gate 805-3. Thus, the signal RB output from NAND gate 805-3 is the complement of signal WB from OR gate 805-4. Because at the start of time period $t_0$ a read control signal is transferred into the system, address $a_0$ in memory array 810 is applied through the H input bus of mux 803-2 (selected because WB is high to indicate a read operation is taking place) to the address port of memory array 810. The data in memory array 810 at address $a_0$ is then placed on the output bus OUT from memory array 810 and then transmitted through a buffer 812-3 to the input bus to data register 811-1. This data is then stored in register 711-1 on the low-to-high transition of the clock signal at the end of period $t_0$ and the beginning of period $t_1$.

Time Period $t_1$

During period $t_1$ a write signal w1 has been applied to control register 807-1 and the read signal $r_0$ previously in control register 807-1 is transmitted through OR gate 805-4 to control register 807-2. Signal CSB remains low as it will during all operations. Thus, the signal WXB represents the control signal in register 807-1 during the preceding time period $t_0$ whereas the signal WB represents the control signal in register 807-1 during the current time period $t_1$. Because during period $t_1$ a write operation is being called for, the address $a_1$ stored in register 804-1 represents the address to which data $d_1$, to be applied to the XIO pin in the next clock cycle after the address $a_1$ is stored in register 804-1, is to be stored in memory array 810. This data $d_1$ will be transmitted into data register 809-1 two cycles after the address $a_1$ is transferred into register 804-1.

The data stored in register 811-1 during time period $t_1$ is transmitted through the L input bus of mux 803-5, enabled by the low level S/DB signal, to output buffer 812-4 and from there to the XIO bus of the system. Buffer 812-4 is enabled by a high level signal from AND gate 805-10. Gate 805-10 is enabled by the high level signal WXB stored in register 807-2 and the high level signal CSX from mux 803-3. The high level signal CSX reflects the high level output signal from inverter 812-1 during time period $t_0$ stored in register 808-2 on the low-to-high transition of the clock signal at the start of period $t_1$. This high level signal is passed through the L bus of mux 803-3 to become the CSX output signal from mux 803-3.

Time Period $t_2$

During time period $t_2$, a write operation is also called for. Thus, on the low-to-high transition of the clock signal at the start of period $t_2$, write signal w2 is transferred into control register 807-1 and the write signal w1 previously in control register 807-1 is transferred into control register 807-2. Accordingly, WB and WXB become low level signals. The address $a_2$ is stored in address register 804-1 and the address $a_1$ previously stored in address register 804-1 is transferred to address register 804-2. Data $d_1$ is applied to the input data bus XIO and will be transferred into data register 809-1 on the low-to-high transition of the clock signal at the start of the next time period $t_3$.

Time Period $t_3$

At the low-to-high transition of the clock signal at the start of time period $t_3$, the data $d_1$ on the input bus XIO is transmitted into data register 809-1. Also at approximately the same time a new address $a_3$ is placed in address register 804-1 and the address $a_2$ previously in register 804-1 is transferred to address register 804-2. The address $a_1$ previously in address register 804-2 is transferred to address register 804-3. The read signal $r_3$ is transferred into control register 807-1 and the write signal w2 previously in control register 807-1 during period $t_2$ is transferred into register 807-2.

The address signal $a_3$ stored in register 804-1 is transmitted through the H input bus of mux 803-2, selected by signal WB being high, to the address port of memory array 810. Because a read operation is being called for, if address $a_3$ stored in address register 804-1 equals the address $a_2$ stored in address register 804-2 or the address $a_1$ stored in address register 804-3, then comparator 801-1 will produce a high output signal EQX or comparator 801-2 will produce a high output signal EQY, respectively. If address $a_3$ equals address $a_1$ then the high level signal EQY passed through inverter 812-2 causes NAND gate 805-6 to produce a low level signal thereby disabling buffer 812-3. Thus, no output signal will be transmitted from memory array 810 to the output register 811-1. However, because EQY is high EQX is low, and WXB is low, the output signal of AND gate 805-9 is high, and the output signal of OR gate 805-8 is high thereby enabling buffer 812-6 to pass data $d_1$ (DX, the last data received) from register 809-1, to the input bus to output register 811-1. Thus, the data $d_1$ stored in data register 809-1 will be stored in output register 811-1 on the low-to-high transition of the clock signal at the start of time period $t_4$.

If address $a_3$ equals address $a_2$, then the high level signal EQX passed through inverter 812-5 causes NAND gate 805-6 to produce a low level signal thereby disabling buffer 812-3. Thus, no output signal will be transmitted from memory array 810 to the output register 811-1. However, because EQX is high and WXB is low, reflecting the fact that a write signal w2 was stored in control register 807-1 during time period $t_2$ and is stored in register 807-2 during time period $t_3$, AND gate 805-12 produces a high level output signal enabling buffer 812-12 to pass the data $d_2$ on the input bus XIO to the system corresponding to address $a_2$ in register 804-2 to output register 811-1. Thus, the data $d_2$ is passed to the input bus of output register 811-1 to be stored in this register on the low-to-high transition of the clock signal at the start of period $t_4$.

Time Period $t_4$

During time period $t_4$, read signal $r_4$ is stored in control register 807-1 and previous read signal $r_3$ is stored in control register 807-2. Simultaneously, on the low-to-high transition of the clock signal at the start of period $t_4$, address $a_4$ is stored in address register 804-1. Data $d_1$ stored in data register 809-1 is transferred to data register 809-2 and data $d_2$ on the XIO input bus is transferred into data register 809-1. Because the signal WB passed through OR gate 805-1 is high at the end of time period $t_3$ and also at the start of time period $t_4$, address registers 804-2 and 804-3 are disabled and thus retain the addresses $a_2$ and $a_1$, respectively. The address $a_4$ is compared to the addresses stored in address registers 804-2 and 804-3, respectively. If the address $a_4$ equals the address $a_2$ stored in address register 804-2 or the address $a_1$ stored in address register 804-3 then the signal EQX or EQY, respectively will be high. If EQY is high, then EQX will be low and the address $a_1$ stored in address register 804-3 corresponds to the data $d_1$ stored in data register 809-2. Signal WXB is now high level reflecting the storage of the signal $r_3$ in control register 807-2. Consequently, AND gate 805-11 produces a high level output signal which enables buffer 812-10 to pass the data $d_1$ represented by signal DY, stored in data register 809-2, to the input bus of output register 811-1. Data $d_1$ will be stored in output register 811-1 on the low-to-high clock transition of the clock signal at the start of time period $t_5$.

Time Period $t_5$

During time period $t_5$, data in register 811-1 will be passed through the L input bus of mux 803-5 (selected by signal S/DB being low) to output buffer 812-4 and from there to the Data I/O pin XIO to be sent outside the system.

During time period $t_5$ a write signal w5 is stored in control register 807-1 and the read signal $r_4$ previously in this control register is transferred to and stored in control register 807-2. Address $a_5$ is stored in address register 804-1 but address registers 804-2 and 804-3 continue to store addresses $a_2$ and $a_1$, respectively because these two registers are still disabled by the read signal $r_4$ at the low-to-high transition of the clock signal at the start of time period $t_5$.

Because this is a write operation, the data $d_1$ in data register 809-2 is to be written into memory array 810 at the address $a_1$ stored in address register 804-3. The system writes data into memory array 810 on the second write operation after the address to which the data is to be written is stored in address register 804-1. Signal WB is low therefore the mux 803-2 passes the address $a_1$ in address register 804-3 directly to the L input bus of mux 803-2 to the address port of memory 810. Simultaneously, the data DY stored in data register 809-2 is applied through the H input bus of mux 803-7 selected by the high signal WXB from control register 807-2 passed through the L input bus of mux 803-6 (selected by the low S/DB signal) to the L input bus of mux 803-8 (also selected by the low S/DB signal) to the select input lead of mux 803-7. Thus, the data $d_1$, represented in FIGS. 9 and 10A by the signal DY, is passed through the H input bus of mux 803-7 to the Data In port of memory array 810 and stored in memory array 810 at the location given by address $a_1$ in register 804-3.

Time Period $t_6$

On the low-to-high transition of the clock signal at the start of time period $t_6$, address $a_6$ is placed in address register 804-1 and address $a_5$ previously in this register is transmitted to address register 804-2.

Address $a_2$ previously in address register 804-2 is transferred to address register 804-3. Control signal w6, a write signal (low), is transferred into control register 807-1 and control signal w5, also a write signal (low), is transferred from control register 807-1 to control register 807-2. Data $d_1$ remains in register 809-2 and data $d_2$ remains in register 809-1 because these registers are disabled by the high level signal WXB from control register 807-2 passed to the L input bus of mux 803-6 and from there through OR gate 805-5 (enabled by the low XENB signal) to disable data registers 809-1 and 809-2.

A write operation is to take place during time period $t_6$. This write operation involves the transfer of the data $d_2$ in data register 809-1 into SRAM 810 at the address $a_2$ now stored in address register 804-3. Because WB is low reflecting the write signal w6 stored in control register 807-1, the address $a_2$ is transmitted from address register 804-3 through the L input bus of mux 803-2 to the address port of memory array 810.

Data $d_2$, however, is stored in data register 809-1. The data $d_2$ in data register 809-1 is transmitted through the L input bus of mux 803-7 selected by the low output signal from mux 803-8 transmitted from the WXB output lead of control register 807-2 through the L input bus of mux 803-6 to the L input bus of mux 803-8 to the select input lead of mux 803-7. The low signal WXB (note that WXB goes low during period $t_6$ because write signal w5 is transmitted into register 807-2 during period $t_6$) thus ensures that the data $d_2$ is passed through mux 803-7 from data register 809-1 to the Data In port of memory array 810 and placed at the location in memory array 810 given by address $a_2$ during period $t_6$.

Data $d_5$, corresponding to address as, is placed on the input bus XIO.

Time Period $t_7$

At the low-to-high transition of the clock signal at the start of period $t_7$, address signal $a_7$ is stored in address register 804-1. Addresses $a_6$ and $a_5$ are transferred to address registers 804-2 and 804-3, respectively. Read signal r7 is transmitted into and stored in the control register 807-1 and the write signal w6 previously in register 807-1 is transferred into and stored in register 807-2. Data $d_5$ corresponding to the write address $a_5$ received and stored in address register 804-1 during period $t_5$, is stored in data register 809-1 and the data $d_2$ previously stored in register 809-1 is transferred to and stored in register 809-2. WXB is low and thus data registers 809-1 and 809-2 are enabled. Because a read operation is being carried out during period $t_7$, the data stored in memory array 810 at address $a_7$ is to be read out of the memory array. However, if this data corresponds to the data at the address $a_6$ stored in address register 804-2 or to the data at the address as stored in address register 804-3, EQX or EQY from comparator 801-1 or comparator 801-2 will be high, respectively. Under these circumstances, the data $d_5$ stored in data register 809-1 or the data $d_6$ applied to the Data I/O port (shown as signal XIO) will be selected to be transferred to the input bus to storage register 811-1. If the data $d_6$ is selected, reflecting the high level EQX signal, then WXB, which is low, will be inverted by inverter 812-13 and applied to one input lead of AND gate 805-12. The high level signal EQX will be applied to the other input lead of AND gate 805-12 causing AND gate 805-12 to produce a high level output signal which enables buffer 812-12. Buffer 812-12 transmits the data signal $d_6$ on the input I/O bus directly to the input bus to register 811-1 to be stored in register 811-1 on the low-to-high transition of the clock signal at the start of the next time period $t_8$. Thus, during period $t_8$, the data $d_6$ stored in register 811-1 will be read out of register 811-1 through the L input bus of mux 803-5 and through the output buffer 812-4 (enabled by WXB and CSX both high and XOEB low) to the I/O output bus. The circuit continues to operate as described above as additional read and write signals are applied to the circuit.

FIG. 10B illustrates the operation of the circuit of FIG. 9 for the sequence of control signals read, write, read, write, read, write, read, read.

Time Period $t_0$

At time $t_0$ ($t_0$ is a time arbitrarily selected during the operation of the system), the address signal $a_0$ is loaded into address register 804-1. A high level signal XWEB corresponding to a read $r_0$ is loaded into control register 807-1.

Time Period $t_1$

At the low-to-high transition of the clock signal at the start of period $t_1$, address $a_1$ is loaded into address register 804-1. Because the signal WB is still high, reflecting the read control signal $r_0$ in control 807-1 during time period $t_0$, OR gate 805-1 produces a high output signal disabling address registers 804-2 and 804-3. Therefore the address $a_0$ in register 804-1 is essentially lost and replaced with address $a_1$. The control signal w1, a low write signal, is read into control register 807-1 causing the signal WB to become low and the signal RB output from NAND gate 805-3 to become high. The write signal w1 indicates that data $d_1$ is going to be applied to XIO, the Data I/O terminal, sometime during the next clock period and will be written into the data register 809-1 during the second following clock period. Meanwhile any data d0 being read out of the system as a result of the read control signal during period $t_0$ is transferred into output register 811-1 on the low-to-high transition of the clock signal at the start of the time period $t_1$. This data d0, the data at address $a_0$ in memory array 810, is transferred through buffer 812-3 enabled by EQY and EQX both being low thereby causing the output signal from AND gate 805-6 to be high and thus enable buffer 812-3. From register 811-1, this data d0 is transmitted on the L input bus of mux 83-5, through buffer 812-4, to the Data I/O.

Time Period $t_2$

On the low-to-high transition of the clock signal at the start of period $t_2$, address $a_2$ is read into address register 804-1. Address $a_1$ previously in address register 804-1 is transferred into address register 804-2, enabled by the low write signal WB during time period $t_1$. Any address in address register 804-2 is also transferred through mux 803-1 to address register 804-3 during the same low-to-high transition of the clock signal. The read signal $r_2$ is transferred into control register 807-1 and the low level write signal w1 previously in control register 807-1 during time period $t_1$ is transferred to control register 807-2. Therefore WXB, the output signal from control register 807-2 is low during time period $t_2$. Because the operation during time period $t_2$ is a read, information contained at address $a_2$ in SRAM memory 810 is transferred to the data output of memory array 810 and through enabled buffer 812-3 to the input port of register 811-1. If, however, the address $a_2$ stored in address register 804-1 of the information to be read from the memory system is equal to the address $a_1$ stored in address register 804-2, comparator 804-1 produces a high level signal EQX. High level signal EQX disables buffer 812-3 and means that the data $d_1$ being applied to the input bus XIO during time period $t_2$ must also be transferred to the input bus of the output register 811-1 because this is the data to be read out from the circuit during period $t_2$ in response to the read signal $r_1$. This data $d_1$, represented by the signal XIO, is applied directly to the input bus to buffer 812-12. Buffer 812-12 is enabled by the high level EQX signal from comparator 801-1 together with the low level signal WXB inverted by inverter 812-13 to produce a high level output signal from NAND gate 805-12. Thus, the data $d_1$ on the input bus XIO is transferred to the input bus D of output register 811-1.

Time Period $t_3$

On the low-to-high transition of the clock signal at the start of time period $t_3$, the data $d_1$ on the input bus D of output register 811-1 is transferred into register 811-1. The data $d_1$ is also transferred into data register 809-1 and the address $a_3$ is transferred into address register 804-1. Write control signal w3 is transferred into control register 807-1 and the read control signal $r_2$ previously in control register 807-1 is transferred through OR gate 805-4 enabled by the low level CSB signal from chip select register 808-1 to control register 807-2. Thus, the signal WXB goes high. Because during time period $t_2$ the signal WB is high level, the address signal $a_2$ in register 804-1 is not transferred into address register 804-2 and the address signal $a_1$ in address 804-2 remains in address register 804-2. The write signal w3 is stored in control register 807-1. Thus, the signal WB goes low. The address stored in register 804-3 is transferred through the L input bus of mux 803-2 to the address port of memory array 810. The data previously in data register 809-2 is transmitted through the H input bus of mux 803-7 (selected by the high WXB signal passed through the L input bus of mux 803-6 and the L input bus of mux 803-8) to the Data In port of memory array 810. WXB going high disables data registers 809-1 and 809-2 so that on the low-to-high transition of the clock signal at the start of the next time period $t_4$, the data in these two registers will remain in place and not be transferred. However, the address registers 804-2 and 804-3 are enabled so that the addresses in registers 804-1 and 804-2 can be transferred to registers 804-2 and 804-3, respectively, on the low-to-high transition of the clock signal at the start of time $t_4$.

Time period $t_4$

On the low-to-high transition of the clock signal at the start of time period $t_4$, address $a_4$ is loaded into address register 804-1. Address $a_3$ previously in address register 804-1 is transferred to address register 804-2 and address $a_1$ previously in address register 804-2 is transferred to address register 804-3. The read signal $r_4$ is transferred into control register 807-1 and the write signal w3 previously in control register 807-1 is transferred through OR gate 805-4 into control register 807-2. Thus, the signal WXB goes low. The read signal $r_4$ means that information $d_4$ contained in memory array 810 at the location given by address $a_4$ is to be read out of memory array 810. If, however, the address $a_4$ equals the address $a_3$ stored in address register 804-2 or equals the address $a_1$ stored in address register 804-3, the output signal EQX from comparator 801-1, or the output signal EQY from comparator 801-2, goes high. If both EQX and EQY are not high, then the data stored at address $a_4$ is passed through the Data Out port from SRAM 810 and through buffer 812-3 to the input bus of output register 811-1. On the low-to-high transition of the clock signal at the start of the next time period $t_5$, this data will be loaded into output register 811-1 and passed through the L input bus of mux 803-5 to buffer 812-4 and then read out of the system. If, however, EQX is high then the address $a_4$ of the data to be read out from the memory array equals the address $a_3$ stored in address register 804-2. The address $a_3$ corresponds to data $d_3$ placed on the input bus XIO. EQX being high and WXB being low (to reflect the write signal w3 stored in control register 807-2) causes AND gate 805-12 to produce a high output signal to enable buffer 812-12. The data signal $d_3$ is thereby passed directly to the input bus of output register 811-1. This data signal $d_3$ will then be stored in output register 811-1 on the low-to-high transition of the clock signal at the start of time period $t_5$.

Alternatively, if EQY is high, then the address $a_4$ equals the address $a_1$ stored in address register 804-3. The address $a_1$ corresponds to the data $d_1$ stored in data register 809-1. Accordingly, the data $d_1$ (corresponding to the signal DX) is read out of the system through buffer 812-6. Buffer 812-6 is enabled by a high output signal from AND gate 805-9 caused by a high signal EQY applied to one input lead and low signals EQX and WXB applied to and inverted by inverters 812-8 and 812-9, respectively. Thus, the data $d_1$ is transferred through buffer 812-6 to the input bus of output register 811-1 to be loaded into output register 811-1 on the low-to-high transition of the clock signal at the start of the next time period $t_5$.

The system continues to operate as described above with the data corresponding to a given write signal being written into memory array 810 two write cycles following the loading of the address corresponding to that data into address register 804-1.

SINGLE PIPELINE OPERATION OF THE CIRCUIT OF FIG. 9

Figure 10C:
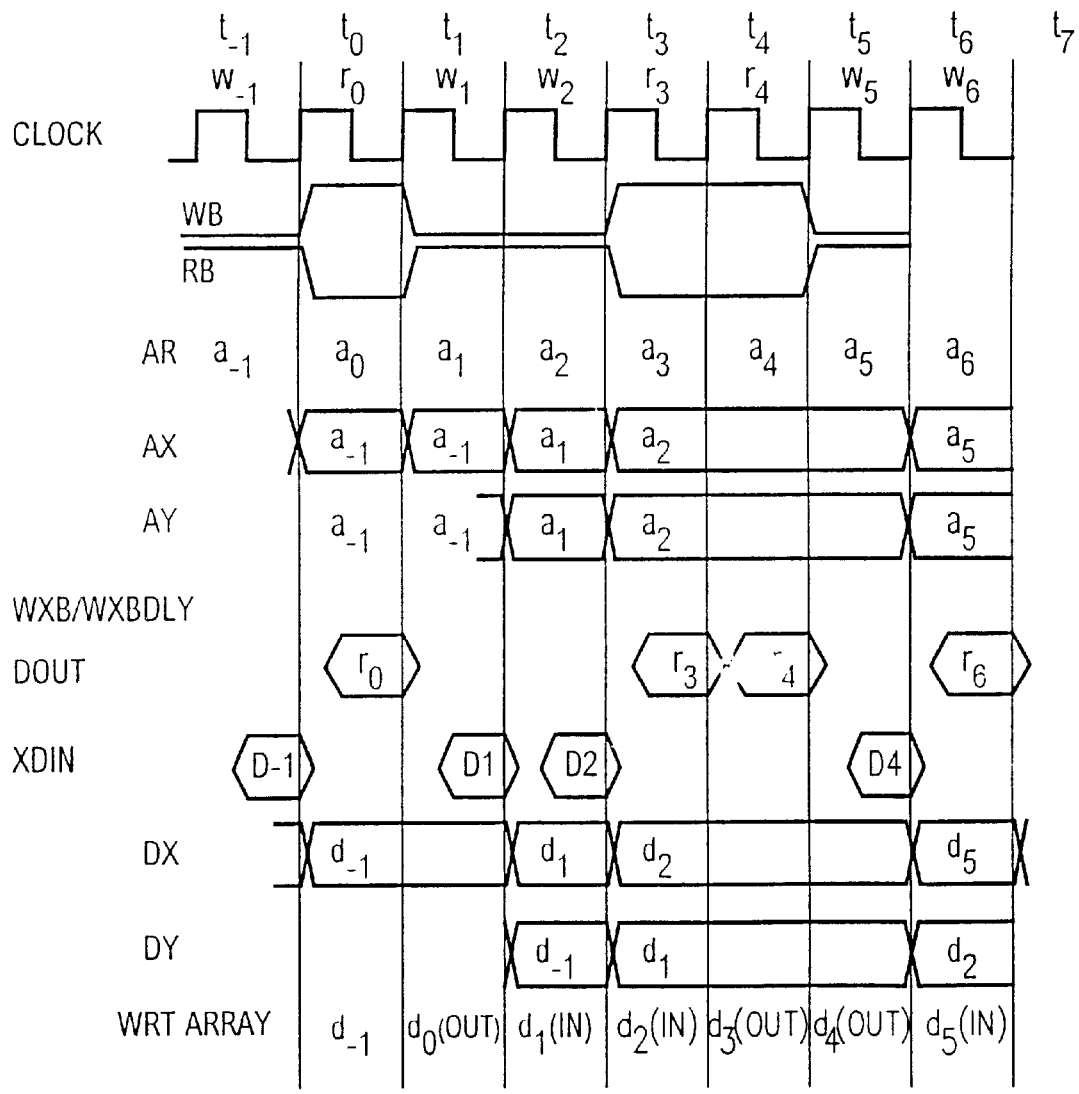
FIG. 10C shows timing waveforms illustrating the operation of the embodiment of FIG. 9 in the one stage pipeline mode for one sequence of read/write signals.

While the circuit in FIG. 9 has been described in conjunction with the dual pipeline operation, the single pipeline operation of the circuit requires the signal S/DB to be high. Thus, muxes 803-1, 803-3, 803-5, 803-6 and 803-8 will all have their high input buses selected for the transmission of signals to the output bus from the mux. FIG. 10C illustrates the timing waveforms associated with the system shown in FIG. 9 for the single pipeline delay.

Time Period $t_0$

On the low-to-high transition of the clock signal at the start of time period $t_0$ (a time arbitrarily selected after the system has begun operating), address $a_0$ is read into address register 804-1. Read signal $r_0$ is read into control register 807-1. Thus, the signal WB is high and thus the address $a_0$ is transmitted directly through the H input bus of mux 803-2 to the address port of memory array 810.

The address a-1 is transferred simultaneously into address register 804-2 and address register 804-3, the latter register receiving the output signal from mux 803-1, the input signal to mux 803-1 being applied to the H input bus directly from the output bus of register 804-1. If address $a_0$ equals address a-1 stored in both registers 804-2 and 804-3, then both EQX and EQY from comparators 801-1 and 801-2 are high. The high EQY signal causes mux 803-4 to pass the DX signal reflecting the data signal in register 809-1 through the H input bus of mux 803-4 to the H input bus of mux 803-5 and from there through buffer 812-4 to the XIO pin of the circuit. Because EQY is high, the signal DX is the data $d_{-1}$ stored in data register 809-1. Note that in the single pipeline mode, signals EQX and EQY are both simultaneously high or simultaneously low because the same address is stored in both data registers 804-2 and 804-3.

Time Period $t_1$

On the low-to-high transition of the clock signal at the start of time period $t_1$, the address signal $a_1$ is written to address register 804-1. Because the signal WB is high at the start of time period $t_1$, the address registers 804-2 and 804-3 retain their contents, namely the address a-1 in both registers. Because a write signal w1 is stored in control register 807-1 and the previous read signal $r_0$ is stored in control register 807-2, the signal WB is low and the signal RB is high. Because the write operation is to take place, and because WB is low, the address a-1 stored in address register 804-3 is transmitted directly through the L input bus of mux 803-2 (selected because the control signal WB is low). The data $d_{-1}$ in data register 809-1 is then written into memory array 810 at the address a-1 stored in address registers 804-2 and 804-3.

Time Period $t_2$

On the low-to-high transition of the clock signal at the start of time period $t_2$, the address signal $a_2$ is written to address register 804-1. Because the signal WB is low at the start of time period $t_2$, the address $a_1$ in address register 804-1 is transferred to register 804-2 and also to 804-3. On the low-to-high transition of the clock signal at the start of time period $t_2$, the write signal w2 is transferred into control register 807-1. The previous write signal w1 stored in control register 807-1 is transferred to control register 807-2. Thus the signal WXB is low as is the signal WB. The data $d_1$ is stored in data register 809-1 and the data $d_{-1}$ is transferred from data register 809-1 to data register 809-2. Because WB is low, the address $a_1$ in address register 804-3 is transmitted directly to the address port of SRAM 810 and the data $d_1$ in data register 809-1 is transmitted directly to the Data In port of SRAM 810 to be stored there at address $a_1$. The data $d_2$ corresponding to the address $a_2$ is placed on the Data I/O pin during the time period $t_2$.

Time Period $t_3$

On the low-to-high transition of the clock signal at the start of time period $t_3$, the address signal $a_3$ is read into address register 804-1. Simultaneously the data $d_2$ placed on the input bus XIO during the latter portion of time period $t_2$ is read into data register 809-1 and the data $d_1$ previously in data register 809-1 is transferred to data register 809-2. Both of these registers are enabled at the start of time period $t_3$ by the low level write signal w2 stored in control register 807-1 during time period $t_2$. This low level signal is transferred through the H input bus of mux 803-6 and through one input lead of OR gate 805-5 to enable these two data registers.

On the low-to-high transition of the clock signal at the start of time period $t_3$, the signal w2 in control register 807-1 is transferred to control register 807-2 and the signal $r_3$, a read signal, is transferred into control register 807-1. The signal WB becomes high level thereby selecting the H input bus of mux 803-2 which passes the address $a_3$ from address register 804-1 through mux 803-2 to the address port associated with memory array 810. Simultaneously the address $a_2$ previously in address register 804-1 is stored in address registers 804-2 and 804-3.

If address $a_3$ equals address $a_2$, then both EQX and EQY go high thereby both disabling buffer 812-3. EQY high selects the H input bus of mux 803-4 which thereby passes to the H input bus of mux 803-5 and through the output buffer 812-4 to the XIO port the data $d_2$ associated with the address $a_2$.

Thus, the single pipeline delay system operates to either read out of memory the data at the address associated with a read control signal or to read out of a data storage register the data associated with the address of the location in memory to be read from when that address is the immediately preceding address of data to be written to the memory.

While several embodiments of this invention have been described, other embodiments of this invention will be obvious to those skilled in the art. In particular, embodiments involving three or more pipeline delays will be obvious in view of this disclosure. Also, while a single Data I/O terminal is shown in FIGS. 7, 7A and 7B, for example, for receiving data to be written into or being read from the memory 710, in practice separate data input and data output terminals can be used, if desired.

I claim:

1. A memory structure, comprising:
    a memory array;
    at least one address register, the at least one address register latching an address on a rising edge of a clock signal;
    at least one data register, the at least one data register latching a data word on the rising edge of the clock signal;
    a logic circuit coupled to the memory array, the at least one address register, and the at least one data register,
    wherein, the logic circuit operates in a write operation such that a write address is presented to the at least one address register in a first write clock cycle and a write data word is presented to the at least one data register in a second clock cycle following the first write clock cycle by a predetermined number of clock cycles; and
    wherein the logic circuit operates in a read operation such that a read address is presented in a first read clock cycle and a read data word corresponding to the read address is presented to an output buffer in a second read clock cycle following the first read clock cycle by the predetermined number of clock cycles.

2. The structure of claim 1, wherein the read operation may occur in the following clock cycle from the write operation.

3. The structure of claim 1, wherein a second read operation may occur in the following clock cycle from the read operation.

4. The structure of claim 1, wherein the write operation may occur in the following clock cycle from the read operation.

5. The structure of claim 1, wherein a second write operation may occur in the following clock cycle from the write operation.

6. The structure of claim 1, wherein the data word is stored in the at least one data registers for a predetermined number of write cycles and then written into the memory array.

7. The structure of claim 6, wherein the data word corresponding to the read address is the last data word corresponding to the read address presented to the structure in a write operation.

8. The structure of claim 1, wherein the predetermined number of clock cycles is one.

9. The structure of claim 1, wherein the predetermined number of clock cycles is two.

10. The structure of claim 1, wherein the predetermined number of clock cycles is greater than two.

11. A memory structure, comprising:
    at least two address registers coupled in series, each of the at least two address registers including an enable terminal such that the at least two address registers store an address presented to their input terminals on a rising edge of a clock signal;
    at least two data registers coupled in series, each of the at least two data registers storing a data word presented to their input terminals on the rising edge of the clock signal;
    a memory array;
    a logic circuit coupled to the at least two address registers, the at least two data registers, and the memory array, the logic circuit coupled to control presentation of addresses stored in the at least two address registers and data words stored in the at least two data registers to the memory array; and
    wherein, in a write operation, the logic circuit controls the at least two address registers and the at least two data registers such that write address is stored in the at least two address registers in a first write clock cycle and a write data word corresponding to the write address is stored in the at least two data registers in a second write clock cycle following the first write clock cycle by a predetermined number of clock cycles, and
    wherein, in a read operation, the logic circuit controls the at least two address registers and the at least two data registers such that a read address is presented in a first read clock cycle and a read data word corresponding to the read address is presented to an output terminal in a second read clock cycle following the first read clock cycle by the predetermined number of clock cycles.

12. The structure of claim 11, wherein the predetermined number of clock cycles is one.

13. The structure of claim 11, wherein the predetermined number of clock cycles is two.

14. The structure of claim 11, wherein the predetermined number of clock cycles is greater than two.

15. The structure of claim 11, wherein during the write operation an address and corresponding data word are presented to the memory array.

16. The structure of claim 11, wherein during the read operation if the read address matches an address stored in the at least one address register, the read data word is output from the at least one data register.

17. The structure of claim 11, wherein a second write operation may occur in a clock cycle immediately following the first clock cycle.

18. The structure of claim 11, wherein the write operation may occur in a clock cycle immediately following the clock cycle when the read operation is presented.

19. The structure of claim 11, wherein the read operation may occur in a clock cycle immediately following the first clock cycle.

20. The structure of claim 11, wherein a second read operation may occur in a clock cycle immediately following the clock cycle when the read is presented.

* * * * *